(12) United States Patent
Moore et al.

(10) Patent No.: US 6,930,909 B2
(45) Date of Patent: Aug. 16, 2005

(54) MEMORY DEVICE AND METHODS OF CONTROLLING RESISTANCE VARIATION AND RESISTANCE PROFILE DRIFT

(75) Inventors: John T. Moore, Boise, ID (US); Kristy A. Campbell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/602,720

(22) Filed: Jun. 25, 2003

(65) Prior Publication Data

US 2004/0264234 A1 Dec. 30, 2004

(51) Int. Cl.$^7$ ............................................. G11C 11/00
(52) U.S. Cl. .................... 365/148; 365/158; 365/189.07
(58) Field of Search ................................. 365/148, 158, 365/189.07

(56) References Cited

U.S. PATENT DOCUMENTS

| | | |
|---|---|---|
| 3,271,591 A | 9/1966 | Ovshinsky |
| 3,622,319 A | 11/1971 | Sharp |
| 3,743,847 A | 7/1973 | Boland |
| 3,961,314 A | 6/1976 | Klose et al. |
| 3,966,317 A | 6/1976 | Wacks et al. |
| 3,983,542 A | 9/1976 | Ovshinsky |
| 3,988,720 A | 10/1976 | Ovshinsky |
| 4,177,474 A | 12/1979 | Ovshinsky |
| 4,267,261 A | 5/1981 | Hallman et al. |
| 4,269,935 A | 5/1981 | Masters et al. |
| 4,312,938 A | 1/1982 | Drexler et al. |
| 4,316,946 A | 2/1982 | Masters et al. |
| 4,320,191 A | 3/1982 | Yoshikawa et al. |
| 4,405,710 A | 9/1983 | Balasubramanyam et al. |
| 4,419,421 A | 12/1983 | Wichelhaus et al. |
| 4,499,557 A | 2/1985 | Holmberg et al. |
| 4,597,162 A | 7/1986 | Johnson et al. |

(Continued)

FOREIGN PATENT DOCUMENTS

| | | |
|---|---|---|
| JP | 56126916 | 10/1981 |
| WO | WO 97/48032 | 12/1997 |
| WO | WO 99/28914 | 6/1999 |
| WO | WO 00/48196 | 8/2000 |
| WO | WO 02/21542 | 3/2002 |

OTHER PUBLICATIONS

Kawamoto, Yoji And Nishida, Masaru, Ionic Conduction in $As_2S_3$—$Ag_2S$, $GeS_2$—$GeS$—$Ag_2S$ and $P_2S_5$—$Ag_2S$ Glasses, Journal of Non–Crystalline Solids 20 (1976) 393–404.

(Continued)

Primary Examiner—Huan Hoang
(74) Attorney, Agent, or Firm—Dickstein Shapiro Morin & Oshinsky LLP

(57) ABSTRACT

In a variable resistance memory device such as a PCRAM memory device having an array variable resistance memory cells, a process is performed to detect when the on/off resistance of each variable resistance memory cell has drifted beyond predetermined tolerance levels. When resistance drift beyond the predetermined tolerance levels is detected, at least one reset pulse is applied to the cell to return the cell to its original resistance profile. The reset pulse may be applied in the form of a "hard" write signal, a "hard" erase signal, a "soft" write signal or a "soft" erase signal as appropriate, depending on the direction of the drift and the programmed state of the cell. The "hard" write and erase signals have voltage levels which may be slightly greater in magnitude than the voltage levels of normal write and erase signals, respectively, or may have slightly longer pulse widths than those of the normal write and erase signals, or both. Similarly, the "soft" write and erase signals have voltage levels which are less than that of normal write and erase signals, or may have pulse widths which are less than that of normal write and erase signals, or both.

96 Claims, 12 Drawing Sheets

U.S. PATENT DOCUMENTS

| | | |
|---|---|---|
| 4,608,296 A | 8/1986 | Keem et al. |
| 4,637,895 A | 1/1987 | Ovshinsky et al. |
| 4,646,266 A | 2/1987 | Ovshinsky et al. |
| 4,664,939 A | 5/1987 | Ovshinsky |
| 4,668,968 A | 5/1987 | Ovshinsky et al. |
| 4,670,763 A | 6/1987 | Ovshinsky et al. |
| 4,671,618 A | 6/1987 | Wu et al. |
| 4,673,957 A | 6/1987 | Ovshinsky et al. |
| 4,678,679 A | 7/1987 | Ovshinsky |
| 4,696,758 A | 9/1987 | Ovshinsky et al. |
| 4,698,234 A | 10/1987 | Ovshinsky et al. |
| 4,710,899 A | 12/1987 | Young et al. |
| 4,728,406 A | 3/1988 | Banerjee et al. |
| 4,737,379 A | 4/1988 | Hudgens et al. |
| 4,766,471 A | 8/1988 | Ovshinsky et al. |
| 4,769,338 A | 9/1988 | Ovshinsky et al. |
| 4,775,425 A | 10/1988 | Guha et al. |
| 4,788,594 A | 11/1988 | Ovshinsky et al. |
| 4,795,657 A | 1/1989 | Formigoni et al. |
| 4,800,526 A | 1/1989 | Lewis |
| 4,809,044 A | 2/1989 | Pryor et al. |
| 4,818,717 A | 4/1989 | Johnson et al. |
| 4,843,443 A | 6/1989 | Ovshinsky et al. |
| 4,845,533 A | 7/1989 | Pryor et al. |
| 4,847,674 A | 7/1989 | Sliwa et al. |
| 4,853,785 A | 8/1989 | Ovshinsky et al. |
| 4,891,330 A | 1/1990 | Guha et al. |
| 5,128,099 A | 7/1992 | Strand et al. |
| 5,159,661 A | 10/1992 | Ovshinsky et al. |
| 5,166,758 A | 11/1992 | Ovshinsky et al. |
| 5,177,567 A | 1/1993 | Klersy et al. |
| 5,219,788 A | 6/1993 | Abernathey et al. |
| 5,238,862 A | 8/1993 | Blalock et al. |
| 5,272,359 A | 12/1993 | Nagasubramanian et al. |
| 5,296,716 A | 3/1994 | Ovshinsky et al. |
| 5,314,772 A | 5/1994 | Kozicki |
| 5,315,131 A | 5/1994 | Kishimoto et al. |
| 5,335,219 A | 8/1994 | Ovshinsky et al. |
| 5,341,328 A | 8/1994 | Ovshinsky et al. |
| 5,350,484 A | 9/1994 | Gardner et al. |
| 5,359,205 A | 10/1994 | Ovshinsky |
| 5,360,981 A | 11/1994 | Owen et al. |
| 5,406,509 A | 4/1995 | Ovshinsky et al. |
| 5,414,271 A | 5/1995 | Ovshinsky et al. |
| 5,500,532 A | 3/1996 | Kozicki et al. |
| 5,512,328 A | 4/1996 | Yoshimura et al. |
| 5,512,773 A | 4/1996 | Wolf et al. |
| 5,534,711 A | 7/1996 | Ovshinsky et al. |
| 5,534,712 A | 7/1996 | Ovshinsky et al. |
| 5,536,947 A | 7/1996 | Klersy et al. |
| 5,543,737 A | 8/1996 | Ovshinsky |
| 5,591,501 A | 1/1997 | Ovshinsky et al. |
| 5,596,522 A | 1/1997 | Ovshinsky et al. |
| 5,687,112 A | 11/1997 | Ovshinsky |
| 5,694,054 A | 12/1997 | Ovshinsky et al. |
| 5,714,768 A | 2/1998 | Ovshinsky et al. |
| 5,726,083 A | 3/1998 | Takaishi |
| 5,751,012 A | 5/1998 | Wolstenholme et al. |
| 5,761,115 A | 6/1998 | Kozicki et al. |
| 5,789,277 A | 8/1998 | Zahorik et al. |
| 5,814,527 A | 9/1998 | Wolstenholme et al. |
| 5,818,749 A | 10/1998 | Harshfield |
| 5,825,046 A | 10/1998 | Czubatyj et al. |
| 5,841,150 A | 11/1998 | Gonzalez et al. |
| 5,846,889 A | 12/1998 | Harbison et al. |
| 5,851,882 A | 12/1998 | Harshfield |
| 5,869,843 A | 2/1999 | Harshfield |
| 5,896,312 A | 4/1999 | Kozicki et al. |
| 5,912,839 A | 6/1999 | Ovshinsky et al. |
| 5,914,893 A | 6/1999 | Kozicki et al. |
| 5,920,788 A | 7/1999 | Reinberg |
| 5,933,365 A | 8/1999 | Klersy et al. |
| 5,998,066 A | 12/1999 | Block et al. |
| 6,011,757 A | 1/2000 | Ovshinsky |
| 6,031,287 A | 2/2000 | Harshfield |
| 6,072,716 A | 6/2000 | Jacobson et al. |
| 6,077,729 A | 6/2000 | Harshfield |
| 6,084,796 A | 7/2000 | Kozicki et al. |
| 6,087,674 A | 7/2000 | Ovshinsky et al. |
| 6,117,720 A | 9/2000 | Harshfield |
| 6,141,241 A | 10/2000 | Ovshinsky et al. |
| 6,143,604 A | 11/2000 | Chiang et al. |
| 6,177,338 B1 | 1/2001 | Liaw et al. |
| 6,236,059 B1 | 5/2001 | Wolsteinholme et al. |
| RE37,259 E | 7/2001 | Ovshinsky |
| 6,297,170 B1 | 10/2001 | Gabriel et al. |
| 6,300,684 B1 | 10/2001 | Gonzalez et al. |
| 6,316,784 B1 | 11/2001 | Zahorik et al. |
| 6,329,606 B1 | 12/2001 | Freyman et al. |
| 6,339,544 B1 | 1/2002 | Chiang et al. |
| 6,348,365 B1 | 2/2002 | Moore et al. |
| 6,350,679 B1 | 2/2002 | McDaniel et al. |
| 6,376,284 B1 | 4/2002 | Gonzalez et al. |
| 6,388,324 B2 | 5/2002 | Kozicki et al. |
| 6,391,688 B1 | 5/2002 | Gonzalez et al. |
| 6,404,665 B1 | 6/2002 | Lowery et al. |
| 6,414,376 B1 | 7/2002 | Thakur et al. |
| 6,418,049 B1 | 7/2002 | Kozicki et al. |
| 6,420,725 B1 | 7/2002 | Harshfield |
| 6,423,628 B1 | 7/2002 | Li et al. |
| 6,429,064 B1 | 8/2002 | Wicker |
| 6,437,383 B1 | 8/2002 | Xu |
| 6,440,837 B1 | 8/2002 | Harshfield |
| 6,462,984 B1 | 10/2002 | Xu et al. |
| 6,469,364 B1 | 10/2002 | Kozicki |
| 6,473,332 B1 | 10/2002 | Ignatiev et al. |
| 6,480,438 B1 | 11/2002 | Park |
| 6,487,106 B1 | 11/2002 | Kozicki |
| 6,487,113 B1 | 11/2002 | Park et al. |
| 6,501,111 B1 | 12/2002 | Lowery |
| 6,507,061 B1 | 1/2003 | Hudgens et al. |
| 6,511,862 B2 | 1/2003 | Hudgens et al. |
| 6,511,867 B2 | 1/2003 | Lowery et al. |
| 6,512,241 B1 | 1/2003 | Lai |
| 6,514,805 B2 | 2/2003 | Xu et al. |
| 6,531,373 B2 | 3/2003 | Gill et al. |
| 6,534,781 B2 | 3/2003 | Dennison |
| 6,545,287 B2 | 4/2003 | Chiang |
| 6,545,907 B1 | 4/2003 | Lowery et al. |
| 6,555,860 B2 | 4/2003 | Lowery et al. |
| 6,563,164 B2 | 5/2003 | Lowery et al. |
| 6,566,700 B2 | 5/2003 | Xu |
| 6,567,293 B1 | 5/2003 | Lowery et al. |
| 6,569,705 B2 | 5/2003 | Chiang et al. |
| 6,570,784 B2 | 5/2003 | Lowery |
| 6,576,921 B2 | 6/2003 | Lowery |
| 6,586,761 B2 | 7/2003 | Lowery |
| 6,589,714 B2 | 7/2003 | Maimon et al. |
| 6,590,807 B2 | 7/2003 | Lowery |
| 6,593,176 B2 | 7/2003 | Dennison |
| 6,597,009 B2 | 7/2003 | Wicker |
| 6,605,527 B2 | 8/2003 | Dennison et al. |
| 6,613,604 B2 | 9/2003 | Maimon et al. |
| 6,621,095 B2 | 9/2003 | Chiang et al. |
| 6,625,054 B2 | 9/2003 | Lowery et al. |
| 6,635,914 B2 | 10/2003 | Kozicki |
| 6,642,102 B2 | 11/2003 | Xu |
| 6,646,297 B2 | 11/2003 | Dennison |
| 6,649,928 B2 | 11/2003 | Dennison |
| 6,667,900 B2 | 12/2003 | Lowery et al. |
| 6,671,710 B2 | 12/2003 | Ovshinsky et al. |

| | | |
|---|---|---|
| 6,673,648 B2 | 1/2004 | Lowrey |
| 6,673,700 B2 | 1/2004 | Dennison et al. |
| 6,674,115 B2 | 1/2004 | Hudgens et al. |
| 6,687,153 B2 | 2/2004 | Lowery |
| 6,687,427 B2 | 2/2004 | Ramalingam et al. |
| 6,690,026 B2 | 2/2004 | Peterson |
| 6,696,355 B2 | 2/2004 | Dennison |
| 6,707,712 B2 | 3/2004 | Lowery |
| 6,714,954 B2 | 3/2004 | Ovshinsky et al. |
| 6,768,665 B2 * | 7/2004 | Parkinson et al. .......... 365/148 |
| 2002/0000666 A1 | 1/2002 | Kozicki et al. |
| 2002/0072188 A1 | 6/2002 | Gilton |
| 2002/0106849 A1 | 8/2002 | Moore |
| 2002/0123169 A1 | 9/2002 | Moore et al. |
| 2002/0123170 A1 | 9/2002 | Moore et al. |
| 2002/0123248 A1 | 9/2002 | Moore et al. |
| 2002/0127886 A1 | 9/2002 | Moore et al. |
| 2002/0132417 A1 | 9/2002 | Li |
| 2002/0160551 A1 | 10/2002 | Harshfield |
| 2002/0163828 A1 | 11/2002 | Krieger et al. |
| 2002/0168820 A1 | 11/2002 | Kozicki |
| 2002/0168852 A1 | 11/2002 | Harshfield et al. |
| 2002/0190289 A1 | 12/2002 | Harshfield et al. |
| 2002/0190350 A1 | 12/2002 | Kozicki et al. |
| 2003/0001229 A1 | 1/2003 | Moore et al. |
| 2003/0027416 A1 | 2/2003 | Moore |
| 2003/0032254 A1 | 2/2003 | Gilton |
| 2003/0035314 A1 | 2/2003 | Kozicki |
| 2003/0035315 A1 | 2/2003 | Kozicki |
| 2003/0038301 A1 | 2/2003 | Moore |
| 2003/0043631 A1 | 3/2003 | Gilton et al. |
| 2003/0045049 A1 | 3/2003 | Campbell et al. |
| 2003/0045054 A1 | 3/2003 | Campbell et al. |
| 2003/0047765 A1 | 3/2003 | Campbell |
| 2003/0047772 A1 | 3/2003 | Li |
| 2003/0047773 A1 | 3/2003 | Li |
| 2003/0048519 A1 | 3/2003 | Kozicki |
| 2003/0048744 A1 | 3/2003 | Ovshinsky et al. |
| 2003/0049912 A1 | 3/2003 | Campbell et al. |
| 2003/0068861 A1 | 4/2003 | Li |
| 2003/0068862 A1 | 4/2003 | Li |
| 2003/0095426 A1 | 5/2003 | Hush et al. |
| 2003/0096497 A1 | 5/2003 | Moore et al. |
| 2003/0107105 A1 | 6/2003 | Kozicki |
| 2003/0117831 A1 | 6/2003 | Hush |
| 2003/0128612 A1 | 7/2003 | Moore et al. |
| 2003/0137869 A1 | 7/2003 | Kozicki |
| 2003/0143782 A1 | 7/2003 | Gilton et al. |
| 2003/0155589 A1 | 8/2003 | Campbell et al. |
| 2003/0155606 A1 | 8/2003 | Campbell et al. |
| 2003/0156447 A1 | 8/2003 | Kozicki |
| 2003/0156463 A1 | 8/2003 | Casper et al. |
| 2003/0212724 A1 | 11/2003 | Ovshinsky et al. |
| 2003/0212725 A1 | 11/2003 | Ovshinsky et al. |
| 2004/0035401 A1 | 2/2004 | Ramachandran et al. |

OTHER PUBLICATIONS

Abdel–All, A.; Elshafie,A.; Elhawary, M.M., DC electric–field effect in bulk and thin–film Ge5As38Te57 chalcogenide glass, Vacuum 59 (2000) 845–853.

Adler, D.; Moss, S.C., Amorphous memories and bistable switches, J. Vac. Sci. Technol. 9 (1972) 1182–1189.

Adler, D.; Henisch, H.K.; Mott, S.N., The mechanism of threshold switching in amorphous alloys, Rev. Mod. Phys. 50 (1978) 209–220.

Afifi, M.A.; Labib, H.H.; El–Fazary, M.H.; Fadel, M., Electrical and thermal properties of chalcogenide glass system Se75Ge25–xSbx, Appl. Phys. A 55 (1992) 167–169.

Afifi,M.A.; Labib, H.H.; Fouad, S.S.; El–Shazly, A.A., Electrical & thermal conductivity of the amorphous semiconductor GexSe1–x, Egypt, J. Phys. 17 (1986) 335–342.

Alekperova, Sh.M.; Gadzhieva, G.S., Current–Voltage characteristics of Ag2Se single crystal near the phase transition, Inorganic Materials 23 (1987) 137–139.

Aleksiejunas, A.; Cesnys, A., Switching phenomenon and memory effect in thin–film heterojunction of polycrystalline selenium–silver selenide, Phys. Stat. Sol. (a) 19 (1973) K169–K171.

Angell, C.A., Mobile ions in amorphous solids, Annu. Rev. Phys. Chem. 43 (1992) 693–717.

Aniya, M., Average electronegativity, medium–range–order, and ionic conductivity in superionic glasses, Solid state ionics 136–137 (2000) 1085–1089.

Asahara, Y.; Izumitani, T., Voltage controlled switching in Cu–As–Se compositions, J. Non–Cryst. Solids 11 (1972) 97–104.

Asokan, S.; Prasad, M.V.N.; Parthasarathy, G.; Gopal, E.S.R., Mechanical and chemical thresholds in IV–VI chalcogenide glasses, Phys. Rev. Lett. 62 (1989) 808–810.

Axon Technologies Corporation, Technology Description: *Programmable Metalization Cell(PMC)*, pp. 1–6 (Pre–May 2000).

Baranovskii, S.D.; Cordes, H., On the conduction mechanism in ionic glasses, J. Chem. Phys. 111 (1999) 7546–7557.

Belin, R.; Taillades, G.; Pradel, A.; Ribes, M., Ion dynamics in superionic chalcogenide glasses: complete conductivity spectra, Solid state Ionics 136–137 (2000) 1025–1029.

Belin, R.; Zerouale, A.; Pradel, A.; Ribes, M., Ion dynamics in the argyrodite compound Ag7GeSe5I: non–Arrhenius behavior and complete conductivity spectra, Solid State Ionics 143 (2001) 445–455.

Benmore, C.J.; Salmon, P.S., Structure of fast ion conducting and semiconducting glassy chalcogenide alloys, Phys. Rev. Lett. 73 (1994) 264–267.

Bernede, J.C., Influence du metal des electrodes sur les caracteristiques courant–tension des structures M–Ag2Se–M, Thin solid films 70 (1980) L1–L4.

Bernede, J.C., Polarized memory switching in MIS thin films, Thin Solid Films 81 (1981) 155–160.

Bernede, J.C., Switching and silver movements in Ag2Se thin films, Phys. Stat. Sol. (a) 57 (1980) K101–K104.

Bernede, J.C.; Abachi, T., Differential negative resistance in metal/insulator/metal structures with an upper bilayer electrode, Thin solid films 131 (1985) L61–L64.

Bernede, J.C.; Conan, A.; Fousenan't, E.; El Bouchairi, B.; Goureaux, G., Polarized memory switching effects in Ag2Se/Se/M thin film sandwiches, Thin solid films 97 (1982) 165–171.

Bernede, J.C.; Khelil, A.; Kettaf, M.; Conan, A., Transition from S– to N–type differential negative resistance in Al–Al2O3–Ag2–xSe1+xfilm structures, Phys. Stat. Sol. (a) 74 (1982) 217–224.

Bondarev, V.N.; Pikhitsa, P.V., A dendrite model of current instability in RbAg4I5, Solid State Ionics 70/71 (1994) 72–76.

Boolchand, P., The maximum in glass transition temperature (Tg) near x=1/3 in GexSe1–x Glasses, Asian Journal of Physics (2000) 9, 709–72.

Boolchand, P.; Bresser, W.J., Mobile silver ions and glass formation in solid electrolytes, Nature 410 (2001) 1070–1073.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97–132.

Boolchand, P.; Enzweller, R.N.; Tenhover, M., Structural ordering of evaporated amorphous chalcogenide alloy films: role of thermal annealing, Diffusion and Defect Data vol. 53–54 (1987) 415–420.

Boolchand, P.; Grothaus, J.; Bresser, W.J.; Suranyi, P., Structural orgin of broken chemical order in a GeSe2 glass, Phys. Rev. B 25 (1982) 2975–2978.

Boolchand, P.; Grothaus, J.; Phillips, J.C., Broken chemical order and phase separation in GexSe1-x glasses, Solid state comm. 45 (1983) 183–185.

Boolchand, P., Bresser, W.J., Compositional trends in glass transition temperature (Tg), network connectivity and nanoscale chemical phase separation in chalcogenides, Dept. of ECECS, Univ. Cincinnati (Oct. 28, 1999) 45221–0030.

Boolchand, P.; Grothaus, J. Molecular Structure of Melt–Quenched GeSe2 and GaS2 glasses compared, Proc. Int. Conf, Phys. Semicond. (Eds. Chadi and Harrison) $17^{th}$ (1985) 833–36.

Bresser, W.; Boolchand, P.; Suranyi, P., Rigidity percolation and molecular clustering in network glasses, Phys. Rev. Lett. 56 (1986) 2493–2496.

Bresser, W.J.; Boolchand, P.; Suranyi, P.; de Neufville, J.P, Intrinsically broken chalcogen chemical order in stoichiometric glasses, Journal de Physique 42 (1981) C4–193–C4–196.

Bresser, W.J.; Boolchand, P.; Suranyi, P.; Hernandez, J.G., Molecular phase separation and cluster size in GeSe2 glass, Hyperfine Interactions 27 (1986) 389–392.

Cahen, D.; Gilet, J.–M.; Schmitz, C.; Chernyak, L.; Gartsman, K.; Jakubowicz, A., Room–Temperature, electric field induced creation of stable devices in CuInSe2 Crystals, Science 258 (1992) 271–274.

Chatterjee, R.; Asokan, S.; Titus, S.S.K., Current–controlled negative–resistance behavior and memory switching in bulk As–Te–Se glasses, J. Phys. D: Appl. Phys. 27 (1994) 2624–2627.

Chen, C.H.; Tai, K.L., Whisker growth induced by Ag photodoping in glassy GexSe1-x films, Appl. Phys. Lett. 37 (1980) 1075–1077.

Chen, G.; Cheng, J., Role of nitrogen in the crystallization of silicon nitride–doped chalcogenide glasses, J. Am. Ceram. Soc. 82 (1999) 2934–2936.

Chen, G.; Cheng, J.; Chen, W., Effect of Si3N4 on chemical durability of chalcogenide glass, J. Non–Cryst. Solids 220 (1997) 249–253.

Cohen, M.H.; Neale, R.G.; Paskin, A., A model for an amorphous semiconductor memory device, J. Non–Cryst, Solids 8–10 (1972) 885–891.

Croitoru, N.; Lazarescu, M.; Popescu, C.; Telnic, M.; and Vescan, L., Ohmic and non–ohmic conduction in some amorphous semiconductors, J. Non–Cryst. Solids 8–10 (1972) 781–786.

Dalven, R.; Gill, R., Electrical properties of beta–Ag2Te and beta–Ag2Se from 4.2 to 300K, J. Appl. Phys. 38 (1967) 753–756.

Davis, E.A., Semiconductors without form, Search 1 (1970) 152–155.

Dearnaley, G.; Stoneham, A.M.; Morgan, D.V., Electrical phenomena in amorphous oxide films, Rep. Prog. Phys. 33 (1970) 1129–1191.

Dejus, R.J.; Susman, S.; Volin, K.J.; Montague, D.G.; Price, D.L., Structure of Vitreous Ag–Ge–Se, J. Non–Cryst. Solids 143 (1992) 162–180.

den Boer, W., Threshold switching in hydrogenated amorphous silicon, Appl. Phys. Lett. 40 (1982) 812–813.

Drusedau, T.P.; Panckow, A.N.; Klabunde, F., The hydrogenated amorphous silicon/nanodisperse metal (SIMAL) system–Films of unique electronic properties, J. Non–Cryst. Solids 198–200 (1996) 829–832.

El Bouchairi, B.; Bernede, J.C.; Burgaud, P., Properties of Ag2–xSe1+x/n–Si diodes, Thin Solid Films 110 (1983) 107–113.

El Gharras, Z.; Bourahla, A.; Vautier, C., Role of photoinduced defects in amorphous GexSe1-x photoconductivity, J. Non–Cryst, Solids 155 (1993) 171–179.

El Ghrandi, R.; Calas, J.; Galibert, G.; Averous, M., Silver photodissolution in amorphous chalcogenide thin films, Thin Solid Films 218 (1992)259–273.

El Ghrandi, R.; Calas, J.; Galibert, G., Ag dissolution kinetics in amorphous GeSe5.5 thin films from "in–situ" resistance measurements vs time, Phys. Stat. Sol. (a) 123 (1991) 451–460.

El–kady, Y.L.; The threshold switching in semiconducting glass Ge21Se17Te62, Indian J. Phys. 70A (1996) 507–516.

Elliott, S.R., A unified mechanism for metal photodissolution in amorphous chalcogenide materials, J. Non–Cryst. Solids 130 (1991) 85–97.

Elliott, S.R., Photodissolution of metals in chalcogenide glasses: A unified mechanism, J. Non–Cryst. Solids 137–138 (1991) 1031–1034.

Elsamanoudy, M.M.; Hegab, N.A.; Fadel, M., Conduction mechanism in the pre–switching state of thin films containing Te As Ge Sl, Vacuum 46 (1995) 701–707.

El–Zahed, H.; El–Korashy, A., Influence of composition on the electrical and optical properties of Ge20BixSe80–x films, Thin Solid Films 376 (2000) 236–240.

Fadel, M., Switching phenomenon in evaporated Se–Ge–As thin films of amorphous chalcogenide glass, Vacuum 44 (1993) 851–855.

Fadel, M.; El–Shair, H.T., Electrical, thermal and optical properties of Se75Ge7Sb18, Vacuum 43 (1992) 253–257.

Feng, X.; Bresser, W.J.; Boolchand, P., Direct evidence for stiffness threshold in Chalcogenide glasses, Phys, Rev. Lett. 78 (1997) 4422–4425.

Feng, X.; Bresser, W.J.; Zhang, M.; Goodman, B.; Boolchand, P., Role of network connectivity on the elastic, plastic and thermal behavior of covalent glasses, J. Non–Cryst. Solids 222 (1997) 137–143.

Fischer–Colbrie, A.; Bienenstock, A.; Fuoss, P.H.; Marcus, M.A., Structure and bonding in photodiffused amorphous Ag–GeSe2 thin films, Phys. Rev. B 38 (1988) 12388–12403.

Fleury, G.; Hamou, A.; Viger, C.; Vautier, C., Conductivity and crystallization of amorphous selenium, Phys. Stat. Sol. (a) 64 (1981) 311–316.

Fritzsche, H, Optical and electrical energy gaps in amorphous semiconductors, J. Non–Cryst. Solids 6 (1971) 49–71.

Fritzsche, H., Electronic phenomena in amorphous semiconductors, Annual Review of Materials Science 2 (1972) 697–744.

Gates, B.; Wu, Y.; Yin, Y.; Yang, P.; Xia, Y., Single–crystalline nanowires of Ag2Se can be synthesized by templating against nanowires of trigonal Se, J. Am. Chem. Soc. (2001) currently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013–1018.

Guin, J.–P.; Rouxel, T.; Keryvin, V.; Sangleboeuf, J.–C.; Serre, I.; Lucas, J., Indentation creep of Ge–Se chalcogenide glasses below Tg: elastic recovery and non–Newtonian flow, J. Non–Cryst. Solids 298 (2002) 260–269.

Guin, J.–P.; Rouxel, T.; Sangleboeuf, J.–C; Melscoet, I.; Lucas, J., Hardness, toughness, and scratchability of germanium–selenium chalcogenide glasses, J. Am. Ceram. Soc. 85 (2002) 1545–52.

Gupta, Y.P., On electrical switching and memory effects in amorphous chalcogenides, J. Non–Cryst. Sol. 3 (1970) 148–154.

Haberland, D.R.; Stiegler, H., New experiments on the charge–controlled switching effect in amorphous semiconductors, J. Non–Cryst. Solids 8–10 (1972) 408–414.

Haifz, M.M.; Ibrahim, M.M.; Dongol, M.; Hammad, F.H., Effect of composition on the structure and electrical properties of As–Se–Cu glasses, J. Apply. Phys. 54 (1983) 1950–1954.

Hajto, J.; Rose, M.J.; Osborne, I.S.; Snell, A.J.; Le Comber, P.G.; Owen, A.E., Quantization effects in metal/a–Si:H/metal devices, Int. J. Electronics 73 (1992) 911–913.

Hajto, J.; Hu, J.; Snell, A.J.; Turvey, K.; Rose, M., DC and AC measurements on metal/a–Si:H/metal room temperature quantised resistance devices, J. Non–Cryst. Solids 266–269 (2000) 1058–1061.

Hajto, J.; McAuley, B.; Snell, A.J.; Owen, A.E., Theory of room temperature quantized resistance effects in metal–l–a–Si:H–metal thin film structures, J. Non–Cryst. Solids 198–200 (1996) 825–828.

Hajto, J.; Owen, A.E.; Snell, A.J.; Le Comber, P.G.; Rose, M.J., Analogue memory and ballistic electron effects in metal–amorphous silicon structures, Phil. Mag. B 63 (1991) 349–369.

Hayashi, T.; Ono, Y.; Fukaya, M.; Kan. H., Polarized memory switching in amorphous Se film, Japan. J. Appl. Phys. 13 (1974) 1163–1164.

Hegab, N.A.; Fadel, M.; Sedeek, K., Memory switching phenomena in thin films of chalcogenide semiconductors, Vacuum 45 (1994) 459–462.

Helbert et al., *Intralevel hybrid resist process with submicron capability*, SPIE vol. 333 Submicron Lithography, pp. 24–29 (1982).

Hilt, Dissertation: *Materials characterization of Silver Chalcogenide Programmable Metalization Cells*, Arizona State University, pp. Title p.–114 (UMI Company, May 1999).

Hirose et al., *High Speed Memory Behavior and Reliability of an Amorphous As₂S₃ Film Doped Ag*, Phys. Stat. Sol. (a) 61, pp. 87–90 (1980).

Hirose, Y.; Hirose, H., Polarity–dependent memory switching and behavior of Ag dendrite in Ag–photodoped amorphous As2S3 films, J. Appl. Phys. 47 (1976) 2767–2772.

Holmquist et al., *Reaction and Diffusion in Silver–Arsenic Chalcogenide Glass Systems*, 62 J. Amer. Ceram. Soc., No. 3–4, pp. 183–188 (Mar.–Apr. 1979).

Hong, K.S.; Speyer, R.F., Switching behavior in II–IV–V2 amorphous semiconductor systems, J. Non–Cryst. Solids 116 (1990) 191–200.

Hosokawa, S., Atomic and electronic structures of glassy GexSe1–x around the stiffness threshold composition, J. Optoelectronics and Advanced Materials 3 (2001) 199–214.

Hu, J.; Snell, A.J.; Hajto, J.; Owen, A.E., Constant current forming in Cr/p+a–/Si:H/V thin film devices, J. Non–Cryst. Solids 227–230 (1998) 1187–1191.

Hu, J.; Hajto, J.; Snell, A.J.; Owen, A.E.; Rose, M.J., Capacitance anomaly near the metal–non–metal transition in Cr–hydrogenated amorphous Si–V thin–film devices, Phil. Mag. B. 74 (1996) 37–50.

Hu, J.; Snell, A.J.; Hajto, J.; Owen, A.E., Current–Induced Instability in Cr–p+a–Si:H–V thin film devices, Phil. Mag. B 80 (2000) 29–43.

Huggett et al., Development of silver sensitized germanium selenide photoresist by reactive sputter etching in SF6, 42 Appl. Phys. L –tt., No. 7, pp. 592–594 (Apr. 1983).

Iizima, S.; Sugl. M.; Kikuchi, M.; Tanaka, K., Electrical and thermal properties of semiconducting glasses As–Te–Ge, Solid State Comm. 8 (1970) 153–155.

Ishikawa, R.; Kikuchi, M., Photovoltaic study on the photo–enhanced diffusion of Ag in amorphous films of Ge2S3, J. Non–Cryst. Solids 35 & 36 (1980) 1061–1066.

Iyetomi, H.; Vashishta, P.; Kalla, R.K., Incipient phase separation in Ag/Ge/Se glasses: clustering of Ag atoms, J. Non–Cryst. Solids 262 (2000) 135–142.

Jones, G.; Collins, R.A., Switching properties of thin selenium films under pulsed bias, Thin Solid Films 40 (1977) L15–L18.

Joullie, A.M.; Marucchi, J., On the DC electrical conduction of amorphous As2Se7 before switching, Phys. Stat. Sol. (a) 13 (1972) K105–K109.

Joullie, A.M.; Marucchi, J., Electrical properties of the amorphous alloy As2Se5, Mat. Res. Bull. 8 (1973) 433–442.

Kaplan, T.; Adler, D., Electrothermal switching in amorphous semiconductors, J. Non–Cryst. Solids 8–10 (1972) 538–543.

Kawaguchi et al., *Mechanism of photosurface deposition*, 164–166 J. Non–Cryst. Solids, pp. 1231–1234 (1993).

Kawaguchi, T.; Maruno, S.; Elliott, S.R., Optical, electrical, and structural properties of amorphous Ag–Ge–S and Ag–Ge–Se films and comparison of photoinduced and thermally induced phenomena of both systems, J. Appl. Phys. 79 (1996) 9096–9104.

Kawaguchi, T.; Masui, K., Analysis of change in optical transmission spectra resulting from Ag photodoping in chalcogenide film, Japn. J. Appl. Phys. 26 (1987) 15–21.

Kawasaki, M.; Kawamura, J.; Nakamura, Y.; Aniya, M., Ionic conductivity of Agx(GeSe3)1–x (0<=x<=0.571) glasses, Solid state Ionics 123 (1999) 259–269.

Kluge, G.; Thomas, A.; Klabes, R.; Grotzschel, R., Silver photodiffusion in amorphous GexSe100–x, J. Non–Cryst. Solids 124 (1990) 186–193.

Kolobov, A.V., On the origin of p–type conductivity in amorphous chalcogenides, J. Non–Cryst. Solids 198–200 (1996) 728–731.

Kolobov, A.V., Lateral diffusion of silver in vitreous chalcogenide films, J. Non–Cryst. Solids 137–138 (1991) 1027–1030.

Kolobov et al., Photodoping of amorphous chalcogenides by metals, Advances in Physics, 1991, vol. 40, No. 5, pp. 625–684.

Korkinova, Ts.N.; Andreichin,R.E., Chalcogenide glass polarization and the type of contacts, J. Non–Cryst. Solids 194 (1996) 256–259.

Kotkata, M.F.; Afif, M.A.; Labib, H.H.; Hegab, N.A.; Abdel–Aziz, M.M., Memory switching in amorphous GeSeTl chalcogenide semiconductor films, Thin Solid Films 240 (1994) 143–146.

Kozicki et al., Silver incorporation in thin films of selenium rich Ge–Se glasses, International Congress on Glass, vol. 2, Extended Abstracts, Jul. 2001, pp. 8–9.

Michael N. Kozicki, 1. Programmable Metallization Cell Technology Description, Feb. 18, 2000.

Michael N. Kozicki, Axon Technologies Corp. and Arizona State University, Presentation to Micron Technology, Inc., Apr. 6, 2000.

Kozicki et al., Applications of Programmable Resistance Changes in Metal–Doped Chalcogenides, Electrochemical Society Proceedings, vol. 99–13, 1999, pp. 298–309.

Kozicki et al., Nonoscale effects in devices based on chalcogenide solid solutions, Superlattices and Microstructures, vol. 27, No. 516, 2000, pp. 485–488.

Kozicki et al., Nanoscale phase separation in Ag–Ge–Se glasses, Microelectronic Engineering 63 (2002) pp. 155–159.

Lakshminarayan, K.N.; Srivastava, K.K.; Panwar, O.S.; Dumar, A., Amorphous semiconductor devices: memory and switching mechanism, J. Instn Electronics & Telecom. Engrs 27 (1981) 16–19.

Lal, M.; Goyal, N., Chemical bond approach to study the memory and threshold switching chalcogenide glasses, Indian Journal of pure & appl. phys. 29 (1991) 303–304.

Leimer, F.; Stotzel, H.; Kottwitz, A., Isothermal electrical polarisation of amorphous GeSe films with blocking Al contacts Influenced by Poole–Frenkel conduction, Phys. Stat. Sol. (a) 29 (1975) K129–K132.

Leung, W.; Cheung, N.; Neureuther, A.R., Photoinduced diffusion of Ag in GexSe1–x glass, Appl. Phys. Lett. 46 (1985) 543–545.

Matsushita, T.; Yamagami, T.; Okuda, M., Polarized memory effect observed on Se–SnO2 system, Jap. J. Appl. Phys. 11 (1972) 1657–1662.

Matsushita, T.; Yamagami, T.; Okuda, M., Polarized memory effect observed on amorphous selenium thin films, Jpn. J. Appl. Phys. 11 (1972) 606.

Mazurier, F.; Levy, M.; Souquet, J.L, Reversible and irreversible electrical switching in TeO2–V2O5 based glasses, Journal de Physique IV 2 (1992) C2–185–C2–188.

McHardy et al., The dissolution of metals in amorphous chalcogenides and the effects o electron and ultraviolet radiation, 20, J. Phys. C.: Solid State Phys., pp. 4055–4075 (1987).

Messoussi, R.; Bernede, J.C.; Benhida, S.; Abachi, T.; Latef, A., Electrical characterization of M/Se structures (M=Nl, Bl), Mat. Chem. And Phys. 28 (1991) 253–258.

Mitkova, M.; Boolchand, P., Microscopic origin of the glass forming tendency in chalcogenides and constraint theory, J. Non–Cryst. Solids 240 (1998) 1–21.

Mitkova, M.; Kozicki, M.N., Silver Incorporation in Ge–Se glasses used in programmable metallization cell devices, J. Non–Cryst. Solids 299–302 (2002) 1023–1027.

Mitkova, M.; Wang. Y.; Boolchand, P., Dual chemical role of Ag as an additive in chalcogenide glasses, Phys. Rev. Lett. 83 (1999) 3848–3851.

Miyatani, S.–y., Electronic and Ionic conduction in (AgxCui–x)2Se, J. Phys. Soc. Japan 34 (1973) 423–432.

Miyatani, S.–y., Electrical properties of Ag2Se, J. Phys. Soc. Japan 13 (1958) 317.

Miyatani, S.–y., Ionic conduction in beta–Ag2Te and beta–Ag2Se, Journal Phys. Soc. Japan 14 (1959) 996–1002.

Mott, N.F., Conduction in glasses containing transition metal Ions, J. Non–Cryst. Solids 1 (1968) 1–17.

Nakayama, K.; Kitagawa, T.; Ohmura, M.; Suzuki, M., Nonvolatile memory based on phase transitions in chalcogenide thin films, Jpn. J. Appl. Phys. 32 (1993) 564–569.

Nakayama, K.; Kojima, K.; Hayakawa, F.; Imai, Y.; Kitagawa, A.; Suzuki, M., Submicron nonvolatile memory cell based on reversible phase transition in chalcogenide glasses, Jpn. J. Appl. Phys. 39 (2000) 6157–6161.

Nang, T.T.; Okuda, M.; Matsushita, T.; Yokota, S.; Suzuki, A., Electrical and optical parameters of GexSe1–x amorphous thin films, Jap. J. App. Phys. 15 (1976) 849–853.

Narayanan, R.A.; Asokan, S.; Kumar, A., Evidence concerning the effect of topology on electrical switching in chalcogenide network glasses, Phy. Rev. B 54 (1996) 4413–4415.

Neale, R.G.; Aseltine, J.A., The application of amorphous materials to computer memories, IEEE transactions on electron dev. Ed–20 (1973) 195–209.

Ovshinsky S.R.; Fritzsche, H., Reversible structural transformations in amorphous semiconductors for memory and logic, Mettalurgical transactions 2 (1971) 641–645.

Ovshinsky, S.R., Reversible electrical switching phenomena in disordered structures, Phys. Rev. Lett. 21 (1968) 1450–1453.

Owen, A.E.; LeComber, P.G.; Sarrabayrouse, G.; Spear, W.E., New amorphous–silicon electrically programmable nonvolatile switching device, IEE Proc. 129 (1982) 51–54.

Owen, A.E.; Firth, A.P.; Ewen, P.J.S., Photo–induced structural and physico–chemical changes in amorphous chalcogenide semiconductors, Phil. Mag. B 52 (1985) 347–362.

Owen, A.E.; Le Comber, P.G.; Hajto, J.; Rose, M.J.; Snell, A.J., Switching in amorphous devices, Int. J. Electronics 73 (1992) 897–906.

Owen et al., Metal–Chalcogenide Photoresists for High Resolution Lithography and Sub–Micron Structures, Nanostructure Physics and Fabrication, pp. 447–451 (M. Reed ed. 1989).

Pearson, A.D.; Miller, C.E., Filamentary conduction in semiconducting glass diodes, App. Phys. Lett. 14 (1969) 280–282.

Pinto, R.; Ramanathan, K.V., Electric field induced memory switching in thin films of the chalcogenide system Ge–As–Se, Appl. Phys. Lett. 19 (1971) 221–223.

Popescu, C., The effect of local non–uniformities on thermal switching and high field behavior of structures with chalcogenide glasses, Solid–state electronics 18 (1975) 671–681.

Popescu, C.; Croitoru, N., The contribution of the lateral thermal instability to the switching phenomenon, J. Non–Cryst. Solids 8–10 (1972) 531–537.

Popov, A.I.; Geller, I.KH.; Shemetova, V.K., Memory and threshold switching effects in amorphous selenium, Phys. Stat. Sol. (a) 44 (1977) K71–K73.

Prakash, S.; Asokan, S.; Ghare, D.B., Easily reversible memory switching in Ge–As–Te glasses, J. Phys. D: Appl. Phys. 29 (1996) 2004–2008.

Rahman, S.; Silvarama Sastry, G., Electronic switching in Ge–Bi–Se–Te glasses, Mat. Sci. and Eng. B12 (1992) 219–222.

Rose, M.J.;Hajto,J.;Lecomber,P.G.;Gage,S.M.;Choi,W.K.; Snell,A.J.;Owen,A.E., Amorphous silicon analogue memory devices, J. Non–Cryst. Solids 155 (1989) 168–170.

Rose,M.J.;Snell,A.J.;Lecomber,P.G.;Hajto,J.;Fitzgerald, A.G.;Owen,A.E., Aspects of non–volatility in a –Si:H memory devices, Mat. Res. Soc. Symp. Proc. V 258, 1992, 1075–1080.

Schuocker, D.; Rieder, G., On the reliability of amorphous chalcogenide switching devices, J. Non–Cryst. Solids 29 (1978) 397–407.

Sharma, A.K.; Singh, B., Electrical conductivity measurements of evaporated selenium films in vacuum, Proc. Indian Natn. Sci. Acad. 46, A, (1980) 362–368.

Sharma, P., Structural, electrical and optical properties of silver selenide films, Ind. J. Of pure and applied phys. 35 (1997) 424–427.

Shimizu et al., *The Photo–Erasable Memory Switching Effect of Ag Photo–Doped Chalcogenide Glasses*, 46 B. Chem Soc. Japan, No. 12, pp. 3662–3365 (1973).

Snell, A.J.; Lecomber, P.G.; Hajto, J.; Rose, M.J.; Owen, A.E.; Osborne, I.L., Analogue memory effects in metal/a–Si:H/metal memory devices, J. Non–Cryst. Solids 137–138 (1991) 1257–1262.

Snell, A.J.; Hajto, J.;Rose, M.J.; Osborne, L.S.; Holmes, A.; Owen, A.E.; Gibson, R.A.G., Analogue memory effects in metal/a–Si:H/metal thin film structures, Mat. Res. Soc. Symp. Proc. V 297, 1993, 1017–1021.

Steventon, A.G., Microfilaments in amorphous chalcogenide memory devices, J. Phys. D: Appl. Phys. 8 (1975) L120–L122.

Steventon, A.G., The switching mechanisms in amorphous chalcogenide memory devices, J. Non–Cryst. Solids 21 (1976) 319–329.

Stocker, H.J., Bulk and thin film switching and memory effects in semiconducting chalcogenide glasses, App. Phys. Lett. 15 (1969) 55–57.

Tanaka, K., Ionic and mixed conductions in Ag photodoping process, Mod. Phys. Lett B 4 (1990) 1373–1377.

Tanaka, K.; Iizima, S.; Sugi, M.; Okada, Y.; Kikuchi, M., Thermal effects on switching phenomenon in chalcogenide amorphous semiconductors, Solid State Comm. 8 (1970) 387–389.

Thornburg, D.D., Memory switching in a Type I amorphous chalcogenide, J. Elect. Mat. 2 (1973) 3–15.

Thornburg, D.D., Memory switching in amorphous arsenic triselenide, J. Non–Cryst. Solids 11 (1972) 113–120.

Thornburg, D.D.; White, R.M., Electric field enhanced phase separation and memory switching in amorphous arsenic triselenide, Journal(??) (1972) 4609–4612.

Tichy, L.; Ticha, H., Remark on the glass–forming ability in GexSe1–x and AsxSe1–x systems, J. Non–Cryst. Solids 261 (2000) 277–281.

Titus, S.S.K.; Chatterjee, R.; Asokan, S., Electrical switching and short–range order in As–Te glasses, Phys. Rev. B 48 (1993) 14650–14652.

Tranchant,S.;Peytavin,S.;Ribes,M.;Flank,A.M.;Dexpert, H.;Lagarde,J.P., Silver chalcogenide glasses Ag–Ge–Se: Ionic conduction and exafs structural investigation, Transport–structure relations in fast ion and mixed conductors Proceedings of the 6th Riso International symposium. Sep. 9–13, 1985.

Tregouet, Y.; Bemede, J.C., Silver movements in Ag2Te thin films: switching and memory effects, Thin Solid Films 57 (1979) 49–54.

Uemura, O.; Kameda, Y.; Kokai, S.; Satow, T., Thermally induced crystallization of amorphous Ge0.4Se0.6, J. Non–Cryst. Solids 117–118 (1990) 219–221.

Uttecht, R.; Stevenson, H.; Sie, C.H.; Griener, J.D.; Raghavan, K.S., Electric field induced filament formation in As–Te–Ge glass, J. Non–Cryst. Solids 2 (1970) 358–370.

Viger, C.; Lefrancois, G.; Fleury, G., Anomalous behaviour of amorphous selenium films, J. Non–Cryst. Solids 33 (1976) 267–272.

Vodenicharov, C.; Parvanov,S.; Petkov,P., Electrode–limited currents in the thin–film M–GeSe–M system, Mat. Chem. And Phys. 21 (1989) 447–454.

Wang, S.–J.; Misium, G.R.; Camp, J.C.; Chen, K.–L.; Tigelaar, H.L., High–performance Metal/silicide antifuse, IEEE electron dev. Lett. 13 (1992)471–472.

Weirauch, D.F., Threshold switching and thermal filaments in amorphous semiconductors, App. Phys. Lett. 16 (1970) 72–73.

West, W.C.; Sieradzki, K.; Kardynal, b.; Kozicki, M.N., Equivalent circuit modeling of the Ag|As0.24S0.36Ag0.40|Ag System prepared by photodissolution of Ag. J. Electrochem. Soc. 145 (1998) 2971–2974.

West, W.C., Electrically erasable non–volatile memory via electrochemical deposition of multifractal aggregates, Ph.D. Dissertation, ASU 1998.

Zhang, M.; Mancini, S.; Bresser, W.; Boolchand, P., Variation of glass transition temperature, Tg, with average coordination number, <m>, in network glasses: evidence of a threshold behavior in the slope |dTg/d<m>| at the rigidity percolation threshold (<m>=2.4), J. Non–Cryst. Solids 151 (1992) 149–154.

* cited by examiner

MEMORY DEVICE AND METHODS OF CONTROLLING RESISTANCE VARIATION AND RESISTANCE PROFILE DRIFT

FIELD OF THE INVENTION

The invention relates generally to the field of semiconductor devices and, more particularly, to programmable conductor random access memory (PCRAM) devices.

BACKGROUND OF THE INVENTION

Microprocessor-controlled integrated circuits are used in a wide variety of applications. Such applications include, for example, personal computers, vehicle control systems, telephone networks, and a host of consumer products. As is well known, microprocessors are essentially generic devices that perform specific functions under the control of a software program. This program is stored in one or more memory devices that are coupled to the microprocessor. Not only does the microprocessor access memory devices to retrieve the program instructions, but it also stores and retrieves data created during execution of the program in one or more memory devices.

There are a variety of different memory devices available for use in microprocessor-based systems. The type of memory device chosen for a specific function within a microprocessor-based system depends largely upon what features of the memory are best suited to perform the particular function. For instance, random access memories such as dynamic random access memories (DRAMs) and static random access memories (SRAMs) are used to temporarily store program information and data "actively" being used by the microprocessor. The data stored in random access memories may be read, erased, and rewritten many times during the execution of a program or function. Read only memories (ROMs) such as "write once read many" devices (WORMs) and electrically erasable programmable read only memories (EEPROMs), on the other hand, are used as long term memory devices which permanently store information about the microprocesor system or store software programs or instructions for performing specific functions until erased or deleted by a user, for example.

Random access memories tend to provide greater storage capability and programming options and cycles than read only memories, but they must be continually powered in order to retain their content. Most random access memories store data in the form of charged and discharged capacitors contained in an array of memory cells. Such memory cells, however, are volatile in that the stored charges will dissipate after a relatively short period of time because of the natural tendency of an electrical charge to distribute itself into a lower energy state. For this reason, most random access memories such as DRAMs must be refreshed, that is, the stored value must be rewritten to the cells, about every 100 milliseconds in order to retain the stored data in the memory cells. Even SRAMs, which do not require refreshing, will only retain stored data as long as power is supplied to the memory device. When the power supply to the memory device is turned off, the data is lost.

Read only memories presently used in microprocessor devices are non-volatile, that is, capable of retaining stored information even when power to the memory device is turned off. Some read only memory devices are constructed so that once programmed with data, they cannot be reprogrammed. Even those read only memories that can be reprogrammed have complex structures which are difficult to manufacture, occupy a large amount of space and consume large quantities of power. For these reasons, read only memories are unsuitable for use in portable devices and/or as substitutes for the frequently accessed random access memories, i.e., memories capable of $10^{14}$ programming cycles or more.

Efforts have been underway to create a commercially viable memory device that is both random access-type and nonvolatile. To this end, various implementations of such nonvolatile random access memory devices are presently being developed which store data in a plurality of memory cells by structurally or chemically changing the resistance across the memory cells in response to predetermined signals respectively applied to the memory cells. Examples of such variable resistance memory devices include memories using variable resistance polymers, perovskite, doped amorphous silicon or doped chalcogenide glass.

In a variable resistance memory cell, a first value may be written thereto by applying a signal having a predetermined voltage level to the memory cell, which changes the electrical resistance through the memory cell relative to the condition of the memory cell prior to the application of the signal. A second value, or the default value, may be written to or restored in the memory cell by applying a second signal to the memory cell, to thereby change the resistance through the memory cell back to the original level. The second signal has a voltage level in the negative direction from that of the first signal, and the voltage level of the second signal may or may not be the same magnitude as the voltage level of the first signal. Each resistance state is stable, so that the memory cells are capable of retaining their stored values without being frequently refreshed. In this regard, since the variable resistance materials can be "programmed" to any of the stable resistance values, such variable resistance memory cells are known as programmable conductor random access memory (PCRAM) cells.

The value of the PCRAM cell is read or "accessed" by applying a read signal to determine the resistance level across the cell. The voltage magnitude of the read signal is lower than the voltage magnitude of the signal required to change the resistance of the PCRAM cell. In a binary PCRAM cell, upon determining the resistance level of the PCRAM cell, the detected resistance level is compared with a reference resistance level. Generally, if the detected resistance level is greater than the reference level, the memory cell is determined to be in the "off" state, or storing a value of "0" On the other hand, if the detected resistance level is less than the reference level, the memory cell is determined to be in the "on" state, or storing a value of "1."

FIG. 1 generally shows a basic composition of a PCRAM cell 10 constructed over a substrate 12, having a variable resistance material 16 formed between two electrodes 14, 18. One type of variable resistance material may be amorphous silicon doped with V, Co, Ni, Pd, Fe and Mn as disclosed in U.S. Pat. No. 5,541,869 to Rose et al. Another type of variable resistance material may include perovskite materials such as $Pr_{1-x}Ca_xMnO_3$(PCMO), $La_{1-x}Ca_xMnO_3$ (LCMO), $LaSrMnO_3$ (LSMO), $GdBaCo_xO_y$ (GBCO) as disclosed in U.S. Pat. No. 6,473,332 to Ignatiev et al. Still another type of variable resistance material may be a doped chalcogenide glass of the formula $A_xB_y$, where "B" is selected from among S, Se and Te and mixtures thereof, and where "A" includes at least one element from Group IIIA (B, Al, Ga, In, Tl), Group IVA (C, Si, Ge, Sn, Pb), Group VA (N, P, As, Sb, Bi), or Group VIIA (F, Cl, Br, I, At) of the periodic table, and with the dopant being selected from among the noble metals and transition metals, including Ag, Au, Pt, Cu, Cd, Ir, Ru, Co, Cr, Mn or Ni, as disclosed in U.S. Published Application Nos. 2003/0045054 and 2003/0047765 to Campbell et al. and Campbell, respectively. Yet another type of variable resistance material includes a carbon-polymer film comprising carbon black particulates or graphite, for example, mixed into a plastic polymer, such as that disclosed in U.S. Pat. No. 6,072,716 to Jacobson et al. The material used to form the electrodes 14, 18 can be selected from a variety of conductive materials, such as tungsten, nickel, tantalum, titanium, titanium nitride, aluminum, platinum, or silver, among others.

In a bistable PCRAM cell, the programmable conductor memory element 104 stores a binary 0 when in a high resistance state, and a binary 1 when in the low resistance state. The memory element 104 is ideally programmed to the low resistance state, i.e., to store a binary 1, by applying a signal having a positive voltage with a magnitude at least that of the voltage of a threshold write signal, and can be restored to the high resistance state, i.e., to store a binary 0, by applying a signal having a negative voltage with a magnitude of at least that of the voltage of a threshold erase signal. Of course, the values "0" and "1" relative to the high and low resistance state, respectively, are user-defined, and thus could be reversed, with the high resistance state representing the value "1" and the low resistance state representing the value "0." The memory element can be nondestructively read by applying to the memory element a reading signal having a voltage magnitude of less than the threshold write signal.

As with volatile RAMs, PCRAMs are arranged as an array of memory cells and are written, erased, and read using a controller. Examples of an electrical arrangement of individual PCRAM cells and also of an array of PCRAM cells is disclosed in copending and co-owned U.S. patent application Ser. No. 10/035,197, the contents of which are hereby incorporated by reference.

While the overall arrangement and operation of the different types of variable resistance PCRAMs may be similar regardless of the type of variable resistance material used in the memory elements, much research of late has focused on memory devices using memory elements having doped chalcogenide materials as the variable resistance material. More specifically, memory cells having a variable resistance material formed of germanium-selenide glass having a stoichiometry of $Ge_xSe_{100-x}$, with x ranging from about 20 to about 43, have been shown to be particularly promising for providing a viable commercial alternative to traditional DRAMs.

A specific example of such a chalcogenide PCRAM cell is shown in FIG. 2, in which a layer of an insulating material 24 such as silicon dioxide or silicon nitride formed over a substrate 22, a lower electrode 26 is formed over the insulating layer 24, a first layer of a chalcogenide material 28 formed over the electrode 26, a metal-containing layer 30 deposited over the first layer of chalcogenide material 28, a second layer of chalcogenide material 32 provided over the metal containing layer 30, and an upper electrode 34 formed overlying the second layer of chalcogenide material 32.

The material used to form the electrodes 26, 34 can be selected from a variety of conductive materials, for example, tungsten, nickel, tantalum, titanium, titanium nitride, aluminum, platinum, or silver, among many others. The insulating layer 24 may be formed of silicon nitride or any other conventional insulating nitride or oxide, among others. For the chalcogenide material layers 28, 32 a germanium-selenide glass having a stoichiometry of about $Ge_{40}Se_{60}$ has proven to be one of the more promising compositions among the chalcogenide glass compositions in PCRAMs. Each of the first and second chalcogenide material layers 28, 32 is formed to a thickness of approximately 150 Å.

The metal-containing layer 30 may be formed to a thickness of approximately 470 Å from any of a variety of silver-chalcogenide materials including silver selenide (e.g., $Ag_2Se$), silver sulfide, silver oxide, and silver telluride, with silver selenide being preferred. Providing the metal-containing layer 30 over the first layer of chalcogenide material 28 and then providing a second layer of chalcogenide material 32 over the metal-containing layer 30 allows the metal in the metal-containing layer 30 to be more readily available to the chalcogenide material for switching the chalcogenide material between resistive states.

An exemplary process of manufacturing the variable resistance memory cell shown in FIG. 2 is disclosed in co-pending U.S. patent application Ser. No. 10/225,190, which is commonly assigned to the assignee of the present application, and the contents of which are hereby incorporated by reference.

Generally, a chalcogenide PCRAM cell, such as that having a structure described above with reference to FIG. 2, has an initial and "off" state resistance of over 100 K Ω (e.g., 1 M Ω). To perform a write operation on a chalcogenide memory cell in its normal high resistive state, a signal having at least a threshold voltage is applied to the electrode serving as the anode, with the cathode held at the reference potential or ground. Upon applying the threshold level voltage, i.e., a write signal, the resistance across the memory cell changes to a level dramatically reduced from the resistance in its normal state, to a resistance less than 100 K Ω (e.g., 20K Ω), whereupon the cell is considered to be in the "on" state.

The chalcogenide PCRAM cell retains this new lower level of resistivity until the resistivity is changed again by another qualifying signal applied to one of the electrodes of the cell. For example, the memory cell is returned to the high resistance state by applying an erase signal thereto having a voltage in the negative direction of the voltage applied in the write operation to achieve the lower resistance state. The voltage of the erase signal may or may not be the same magnitude as the voltage of the write signal, but is at least of the same order of magnitude.

Although it is not clearly understood what change or changes are induced in the memory cell by the application of the threshold potential to result in the stable low resistant state, it is believed that the metal ions incorporated into the chalcogenide material layer somehow become aligned into a low resistance conductive configuration between the electrodes once the voltage of the applied signal reaches the threshold level. At least two theories exist as to the precise nature of the alignment.

In one theory, the metal ions within the chalcogenide material begin to progress through the chalcogenide material toward the anode upon the application of a signal having the threshold voltage level of a write operation. The metal ions continue to agglomerate until a conductive dendrite or filament is extended between the electrodes to thereby interconnect the top and bottom electrodes to create an electrical short circuit. Upon application of a signal having the negative threshold voltage level, the dendrite recedes from the anode as the metal ions return to solution in the chalcogenide material or return to the source layer.

In a second theory, when an initial write signal having a threshold positive voltage level is applied to the memory cell, channels of the metal-containing layer, e.g., $Ag_2Se$, are formed in the chalcogenide material, and the metal ions are caused to cluster along the channels. Upon application of an erase signal having a threshold negative voltage level to the cell, the metal ions are caused to move away from the channels, while the channels remain. Subsequent write signals cause the metal ions to re-cluster along the channels. The resistance through the cell in the write and erase states is thus determined by the amount of metal ions clustered along the channels.

The write and erase signals are applied via the circuitry of the overall memory device incorporating a memory of the chalcogenide PCRAM cells. A simplified illustration of a PCRAM programming circuit 50 is shown in FIG. 3A, in which a write signal having a voltage $V_{TW}$ is applied to the top electrode 34 of the PCRAM cell 20. In this example, $V_{TW}$ has a voltage level of +1.0 V and a pulse width, i.e., duration, of about 8 ns. As mentioned above, the natural state of a PCRAM cell is the high resistant state, which, for purposes of illustration, is designated here to correspond to the "off" state, or a binary value of "0." Upon the application of $V_{TW}$ to top electrode 34 of PCRAM cell 20, the PCRAM cell 20 changes to a low resistance i.e., "on" state and, correspondingly, is written to store a binary value of "1."

The relationship between voltage of a signal applied to the PCRAM cell and resistance in the cell for a write operation performed on a properly functioning cell is illustrated in FIG. 4A. The initial or normal resistance level of a PCRAM cell is shown as $R_{OFF}$, which is above a minimum threshold level $R_{EMin}$ in which the PCRAM cell is stable in a high resistance state. When the PCRAM cell is in the high resistance state and a signal of voltage $V_{TW}$ is applied to the cell, the resistance drops to the level indicated by $R_{ON}$, which is below a maximum threshold level $R_{wMax}$ in which the PCRAM cell is stable in a low resistance state.

FIG. 3B shows the same programming circuit 30 illustrated in FIG. 3A, except that an erase signal having a voltage $V_{TE}$ is applied to the bottom electrode 26. $V_{TE}$ has a voltage level of −0.75V and a pulse width of about 8 ns. Upon the application of a signal of voltage $V_{TE}$ to bottom electrode 26 of PCRAM cell 20, the PCRAM cell 20 returns to its high resistance state, i.e., its "off" state, by erasing the binary value of "1" previously written in the cell, so that the value of "0" is again stored in the PCRAM cell 20.

FIG. 4B shows the relationship between resistance through the PCRAM cell 20 and the voltage of a signal applied to the cell during an erase operation. As in FIG. 4A, $R_{ON}$ indicates the resistance level of the PCRAM cell 20 in the low resistance (on) state, and $R_{wMax}$, represents the maximum resistance value at which the PCRAM cell 20 is stable in the low resistance state, while $R_{OFF}$ indicates a resistance level of the PCRAM cell 20 in the high resistance (off) state, and $R_{EMin}$ demonstrates the minimum resistance value at which the PCRAM cell 20 is stable in the high resistance state. When the PCRAM cell 20 is in the low resistance state and $V_{TE}$ is subsequently applied to the cell, the resistance in the PCRAM cell 20 increases to the level indicated by $R_{OFF}$.

It is noted that the voltage $V_{TW}$ of the write signal is not necessarily of the same magnitude as the voltage $V_{TE}$ of the erase signal because a write signal seeks to overcome forces attributable to the physical separation of metal ions from the metal-containing layer 24 and to the diffusion into the variable resistance material 22 against the concentration gradient of the metal ion therein, inter alia, while an erase signal must overcome forces attributable to the agglomeration tendency of the metal ions in the variable resistance material 22 and to the "pushing" of the metal ions back into the metal-containing layer 24, inter alia. The voltage levels required to overcome each set of forces are thus not necessarily the same in the forward and backward directions.

It has been observed that after a number of write/erase operations, the resistance profiles of PCRAM cells such as those shown in FIG. 2, particularly PCRAM cells including a silver selenide layer, have a tendency to shift. Specifically, the cell may eventually write to an "on" state in which the resistance in that state is at an unacceptably high level, or an erase operation may place the cell in an "off" state in which the resistance in that state is at an unacceptably low level. In other cases, the resistance profile of the memory cell may shift so that the resistance in the "on" state is too low, or the resistance in the "off" state is too high. This can happen in as few as about 400 write and erase cycles, which is problematic in that typical life expectancies for random access memory devices are on the order of $10^{14}$ write/erase cycles. Thus, if the resistance drift is not corrected, the PCRAM memory devices will ultimately fail. The phenomenon of resistance drift will be described in further detail below, with reference to FIGS. 5A through 5D.

In the first case, the resistance profile of the chalcogenide material changes over time so that the resistance of the "on" state drifts unacceptably high. In this condition, the resistance in the PCRAM cell for the "on" state gradually becomes higher than the resistance $R_{ON}$ shown in FIG. 4A. As the "on" state resistance drifts higher, application of signals at the threshold write voltage level become less and less effective to fully drive the resistance in the PCRAM cell to or below the maximum stable low resistance level $R_{wMax}$ of the low resistance "on" state. If left unchecked, the memory cell develops an underwrite condition in which application of a write signal will only be able to achieve a resistance $R_{DW1}$ above the maximum stable low resistance $R_{wMax}$, as seen in FIG. 5A. When this happens, the write signal voltage $V_{TW}$ is insufficient to switch the PCRAM cell to the stable "on" state, whereby the function of the PCRAM cell then fails.

In the second case, the resistance of the PCRAM cell drifts unacceptably low in the "off" state. When this happens after repeated write/erase cycles, the "off" state resistance achieved upon application of the erase signals at the threshold voltage $V_{TE}$ falls below the level $R_{OFF}$ shown in FIG. 4B. The resistance $R_{DE1}$ achieved by an erase operation drifts increasingly lower until application of the threshold erase signal voltage $V_{TE}$ becomes insufficient to bring the memory cell to the minimum stable high resistance level $R_{EMin}$, as illustrated in FIG. 5B. Once this undererase condition is reached, subsequent erase operations will fail to erase the stored value in the PCRAM cell, causing a breakdown in the function of the PCRAM device.

In the third case, the resistance profile of the PCRAM cell changes so that the resistance level in the "on" state falls too far below the target level $R_{ON}$ shown in FIG. 4B. While the "on" state is stable at the overwritten resistance level $R_{DW2}$, application of a threshold erase signal to the cell is insufficient to drive the resistance level $R_{OFF2}$ above the stable "off" resistance level $R_{EMin}$, as shown in FIG. 5C. Similarly to the situations described above, this overwrite condition causes the PCRAM cell to fail.

A fourth case can also occur in which the resistance profile of the PCRAM cell drifts to an overerase condition, in which the resistance level $R_{DE2}$ in the "off" state becomes excessively high so that application of a threshold write signal is insufficient to drive the cell to an "on" state. Instead, application of the threshold write signal merely drives the PCRAM cell to a resistance level $R_{ON2}$, which is above the stable resistance level $R_{WMax}$ for the low resistance state, as shown in FIG. 5D. Again, this causes the PCRAM cell to fail.

Since the threshold voltages $V_{TW}$ and $V_{TE}$ for the write and erase signals often differ in magnitude relative to the zero voltage level, the direction of the resistance drift most likely occurs towards the direction having the higher threshold voltage magnitude. For example, in the embodiment described above with reference to FIGS. 4A and 4B, the PCRAM cell 20 may tend to drift towards either an undererase condition (a low resistance "off" state) or an overwrite condition (an excessively low resistance "on" state) because the magnitude of the threshold write signal voltage $V_{TW}$ is greater than the magnitude of the threshold erase signal voltage $V_{TE}$. Similarly, when the threshold erase signal voltage is greater than the threshold write signal voltage, the PCRAM cell 20 may tend to drift towards either towards an overerase condition (an excessively high resistance "off" state) or an underwrite condition (a high resistance "on" state).

Also, in PCRAM memory devices, the necessary voltage level required to switch a memory cell from an "off" (erase) state to an "on" (write) state tends to decrease as the temperature of the cell rises. Thus, undererase and overwrite conditions, i.e., drift towards a low resistance "off" state and excessively low resistance "on" state, respectively, is more likely to occur at higher ambient and/or system temperatures.

Since the voltage levels of the write and erase signals are preset in the memory device so as to be consistently delivered to appropriate memory cells at the predetermined levels during performance of the write and erase functions, the predetermined voltage levels of the applied write and/or erase signals will at some point become insufficient to overcome the drifted threshold level(s) to perform the desired operation. Specifically, the relative concentration of metal ions in the chalcogenide material in the "on" state may build up to a point where subsequent applications of signals at the threshold voltage level used for erase operations may not be sufficient to switch the memory cell back to the high resistance "off" state. In an alternative scenario, the concentration of metal ions in the chalcogenide material may become so depleted or the conduction channels may be driven back into the source layer so that, subsequent applications of signals at the threshold voltage level used for write operations may be insufficient to switch the memory cell to the "on" state. Thus, the eventual effect of such resistance drift over time may cause the memory devices to fail.

BRIEF SUMMARY OF THE INVENTION

One aspect of the present invention addresses the problem explained above. Specifically, the invention provides a method to detect when the on/off resistance of a PCRAM cell has drifted beyond predetermined tolerance levels, whereupon a reset signal is applied to the memory cell as appropriate to return the cell to its original resistance profile. Depending on the nature of the resistance profile drift, the reset pulse may be a "hard" write pulse, a "hard" erase pulse, a "soft" write pulse or a "soft" erase pulse. The "hard" write and erase signals may have slightly greater voltage magnitudes than the voltages of the normal programming write and erase signals, respectively, or may have a slightly longer pulse width than the normal programming write and erase signals, or both. "Soft" write and erase signals, on the other hand, are smaller in both voltage magnitude and pulse width than normal programming write and erase signals. Optionally, the amount of drift can be measured so that the reset signal(s) can be adjusted accordingly.

In another aspect of the invention, resistance drift in the memory cells may be corrected by applying at least one slightly positive or slightly negative voltage pulse to the memory cells to counter the direction of resistance drift. The pulses are similar to the "soft" reset signals mentioned above in that they have smaller voltage magnitudes and/or pulse widths than write and erase signals, so that the stored values in any memory cells programmed to the low resistance state are not rewritten in the process.

These and other features and advantages of the invention will be more apparent from the following detailed description, which is provided in connection with the accompanying drawings and illustrate exemplary embodiments of the invention.

DETAILED DESCRIPTION OF THE INVENTION

Figure 1:
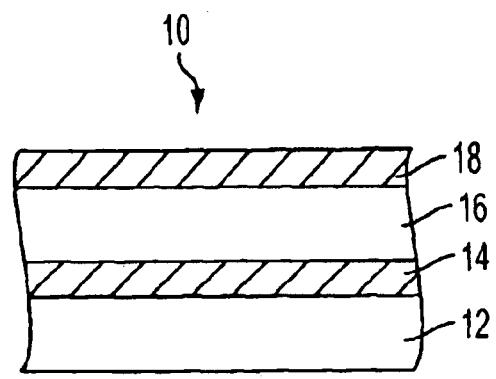
FIG. 1 shows the basic structure of a variable resistance PCRAM cell.

In the following detailed description, reference is made to various specific structural and process embodiments of the invention. These embodiments are described with sufficient detail to enable those skilled in the art to practice the invention. It is to be understood that other embodiments may be employed, and that various structural, logical and electrical changes may be made without departing from the spirit or scope of the invention.

The term "substrate" or "wafer" used in the following description are to be understood as interchangeable and may include any supporting structure including, but not limited to, a plastic or a semiconductor substrate that has an exposed substrate surface. Semiconductor substrates should be understood to include silicon, silicon-on-insulator (SOI), silicon-on-sapphire (SOS), doped and undoped semiconductors, epitaxial layers of silicon supported by a base semiconductor foundation, and other semiconductor structures. When reference is made to a substrate or wafer in the following description, previous process steps may have been utilized to form regions or junctions in or over the base semiconductor or foundation.

The term "silver" is intended to include not only elemental silver, but silver with other trace metals or in various alloyed combinations with other metals as known in the semiconductor industry, as long as such silver alloy is conductive, and as long as the physical and electrical properties of the silver remain unchanged.

The terms "germanium" and "selenium" are intended to include not only elemental germanium and selenium, but germanium and selenium with other trace metals or in various alloyed combinations with other metals as known in the semiconductor industry, as long as such germanium or selenium alloy is conductive, and as long as the physical and electrical properties of the germanium or selenium remain unchanged.

The term "silver-selenide" is intended to include various species of silver-selenide, including some species which have a slight excess or deficit of silver, for instance, $Ag_2Se$, $Ag_{2+x}Se$, and $Ag_{2-x}Se$.

The terms "semi-volatile memory device" and "non-volatile memory device" are intended to include any memory device which is generally capable of maintaining its memory state after power is removed from the device for a prolonged period of time (e.g., minutes, days, or weeks), which the term "semi-volatile memory device" further includes any memory device which may need occasional refreshing to maintain its stored value. Thus, both semi-volatile memory devices and non-volatile memory devices are capable of retaining stored data after the power source is disconnected or removed.

The term "variable resistance material" is intended to include any material usable in programmable conductor memory (PCRAM) elements, semi-volatile memory elements, and non-volatile memory elements which exhibit a resistance change in response to an applied voltage.

While it is not known with certainty why the resistance profile of certain chalcogenide based PCRAM cells drift after a number of write/erase cycles, the inventors theorize that such drift towards an underwrite condition or an over-erase condition may be due to an increasing depletion of the metal ions from the chalcogenide material and into the source layer after numerous erase operations. According to this theory, the resistance profile drifts higher in the "on" state and/or in the "off" state when the voltage of the erase signal has a magnitude which is slightly too high or the voltage of the write signal has a magnitude which is slightly too low, thereby causing more metal ions to be driven out of the chalcogenide material and into the metal-containing source layer with each erase operation, as a whole, than is driven into the chalcogenide material with each write operation. Over time, the changing concentration profile of the metal ions causes the overall conductivity of the memory cell to decrease in the variable resistance material, resulting in an overall increase in the resistance of the memory cell.

Similarly, it is theorized that the resistance profile drift towards an undererase condition or an overwrite condition may be caused by increasing levels of metal ions in the chalcogenide material after numerous write operations. In this case, the drift towards an overly low resistance in the "off" state and/or in the "on" state is believed to occur because the concentration of the metal ions in the chalcogenide material over time generally becomes higher when the voltage of the erase signal is slightly too low or the voltage of the write signal has a magnitude which is slightly too high. With each write/erase cycle, therefore, each erase operation returns fewer ions to the metal-containing source layer from the chalcogenide material than the number of ions driven into the chalcogenide material from the source layer in each write operation. This in turn gradually increases the overall conductivity through the cell after more and more write/erase cycles, resulting in an overall decrease in the resistance of the memory cell.

It is believed that the chalcogenide PCRAM cells are made vulnerable to this accumulation or cumulative depletion effect manifesting as resistance drift because of variations inherently resulting from the manufacture of an array of the PCRAM cells, such as non-optimized materials and cross wafer variations in thicknesses.

The present invention successfully addresses the problem of resistance profile drift in a chalcogenide PCRAM cell based on the theories presented above (and thus provides apparent validation of the theories) by detecting resistance drift in a chalcogenide PCRAM cell using a process which recognizes when the memory cell has drifted outside a predetermined range in either the high or low resistance states, and which corrects any detected resistance drifts outside the predetermined range by applying a reset pulse to the memory cell. The reset pulse is a signal having a voltage in the direction which counters the direction of drift, and has a greater magnitude and/or longer pulse width than the threshold voltages of the write or erase signals normally applied in that direction to program the memory cell.

Figure 6:
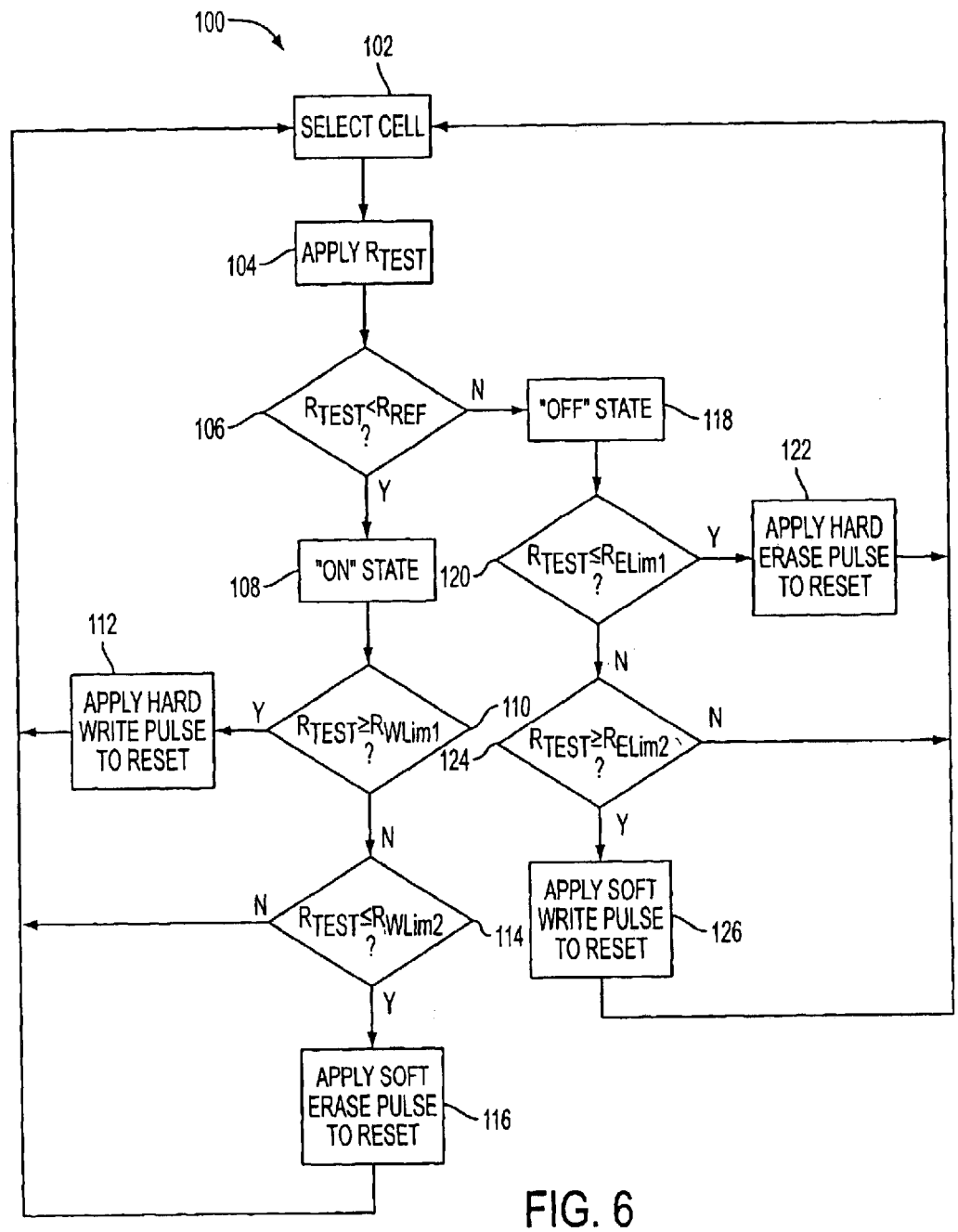
FIG. 6 is a flow chart for explaining a preferred method in accordance with the present invention.

The method according to the present invention is illustrated generally in FIG. 6, which shows a process 100 that is performed for each memory cell in an array of PCRAM memory cells or other type of variable resistance memory cells. The process 100 is a smart algorithm which accounts for the cumulative imbalance in the memory cells occurring over a number of operation cycles. In particular, the process 100 sequentially tests each cell in the array to determine whether the value stored in the memory cell is outside of preset limits for the relevant resistance state. If any drift is detected outside the preset tolerance limits, the process corrects the problem by applying reset pulses having magnitudes and pulse widths as necessary to correct the level of drift which has occurred, so that the original operating condition of the memory device is restored. Preferably, the process 100 is performed at predetermined frequency intervals within the overall operation of the microprocessor device, e.g., once per week, once per 50 hours of processor operating time, etc. Although it is possible to configure the microprocessor to perform the process 100 based on a set number of write/erase cycles of each cell, it is likely prohibitively costly to provide a counter and storage for each memory cell in the array simply to track the number of cycles performed by each cell.

The process 100 will now be described beginning with process segment 102 in FIG. 6, in which a selected memory cell is accessed from among an array of PCRAM memory cells, and a test signal is applied thereto to determine the resistance of the cell at process segment 104. The test signal is similar to a standard read signal in that its voltage is lower in magnitude than the voltages $V_{TW}$ or $V_{TE}$ of the write or erase signals, respectively. As with a standard read operation, the determined resistance $R_{TEST}$ of the cell is compared to a reference resistance level $R_{REF}$ (see FIGS. 4A–5D) to determine if the cell is in the "on" state or "off" state at process segment 106.

If $R_{TEST}$ is less than $R_{REF}$, the memory cell is determined to be in the "on" state at process segment 108, whereupon $R_{TEST}$ is then compared with a value $R_{WLim1}$ (see FIG. 5A), at process segment 110, which defines an upper tolerance resistance level just below the maximum stable resistance $R_{wMax}$, for the low resistance state. If $R_{TEST}$ is greater than or equal to $R_{WLim1}$, then the "on" state resistance is determined to be too high, and a reset pulse is applied in the form of a "hard" write pulse, as will be described below (process segment 112). The process then returns to process segment 102 to check the resistance profile of another cell.

Figure 7A:
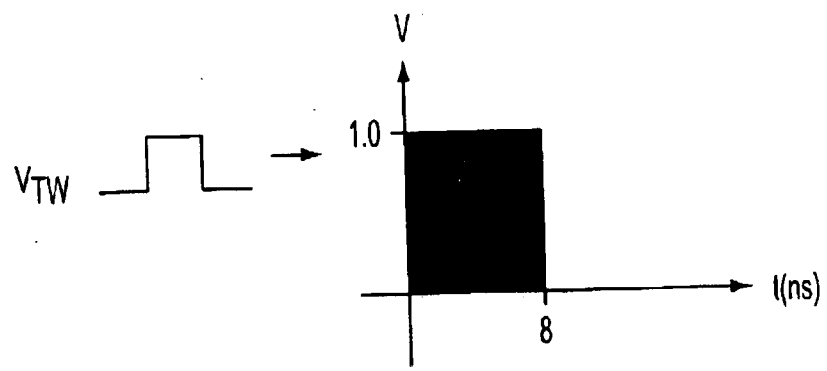
FIG. 7A is a graphical illustration of a pulse applied to a memory cell for a normal write operation.
Figure 7B:
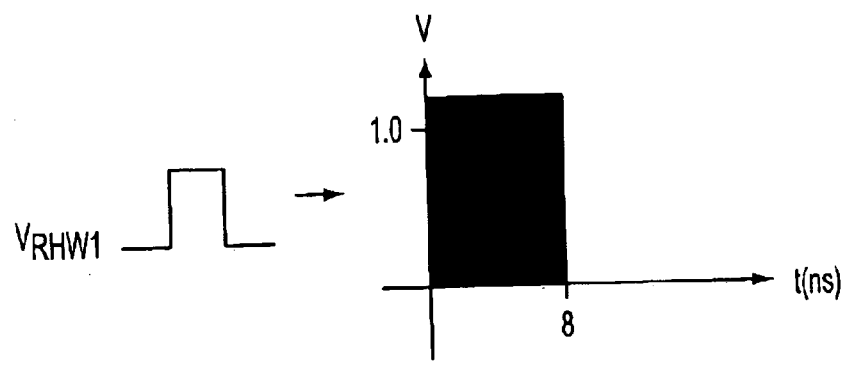
FIG. 7B is a graphical illustration of a "hard" write-type reset pulse having a voltage magnitude greater than that of a normal write pulse, for correcting resistance profile drift in a memory cell in which an "on" state resistance becomes too high.
Figure 7C:
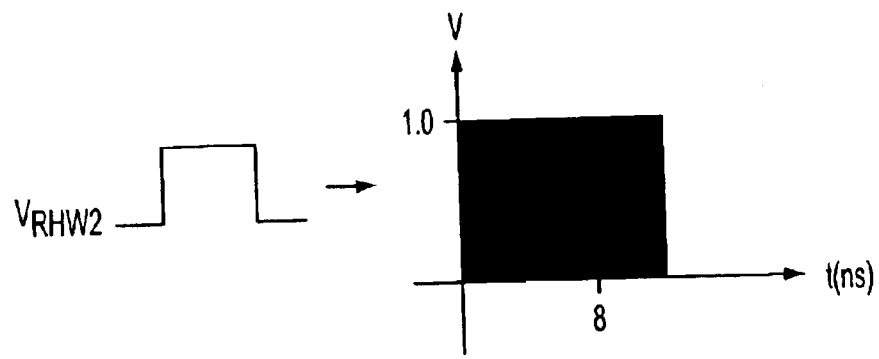
FIG. 7C is a graphical illustration of a "hard" write-type reset pulse having a greater pulse width than that of a normal write pulse, for correcting resistance profile drift in a memory cell in which an "on" state resistance becomes too high.

The "hard" write pulse applied in process segment 112 may be performed in at least one of two ways, as will be described below with reference to FIGS. 7A–7C. FIG. 7A illustrates a "normal" write pulse $V_{TW}$ having, for example, a voltage level of 1.0 V and a duration of 8 ns. A first type of "hard" write pulse is shown in FIG. 7B, in which the applied pulse $V_{RHW1}$ is the same duration as the normal write pulse, but has a voltage higher than the 1.0 V of the normal write pulse. An alternative "hard" write pulse $V_{RHW2}$ is shown in FIG. 7C, in which the "hard" write pulse $V_{RHW2}$ has the same magnitude as the normal write pulse, but has a longer pulse width. In a further alternative, the "hard" write pulse may have both a greater magnitude and a longer duration than the normal write pulse. The amount by which the voltage level or the duration of the "hard" write pulse exceeds that of the normal write pulse may vary depending on the amount of drift as may be detected by the processor or system, i.e., the amount by which $R_{TEST}$ exceeds $R_{WLim1}$.

The application of the "hard" write pulse serves to "shock" the cell back into the original distribution profile. In particular, it is believed that the "hard" write pulse drives an extra amount of metal ions from the source layer into the chalcogenide material to thereby overcome the accumulated depletion of metal ions in the chalcogenide material and restore the memory cell to its original operational state.

Figure 5A:
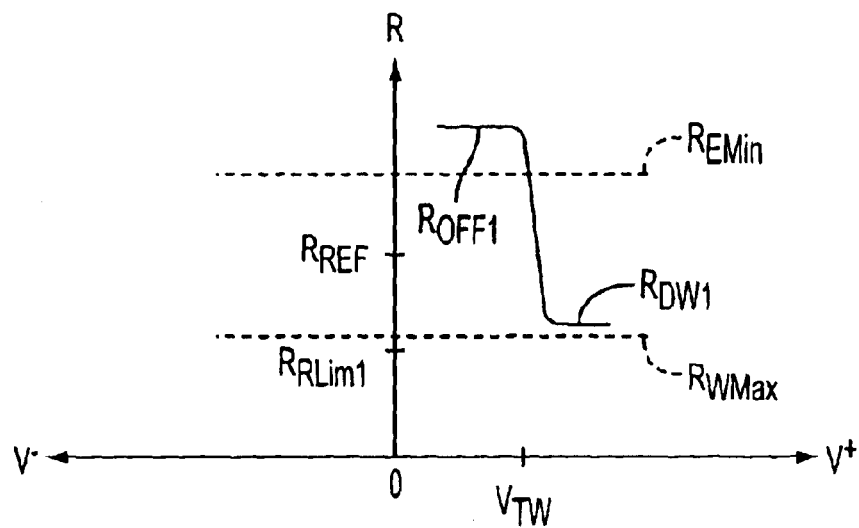
FIG. 5A is a graphical diagram illustrating a write operation in which the resistance profile of the variable resistance memory cell has drifted to effect an "on" state resistance which is too high.
Figure 5B:
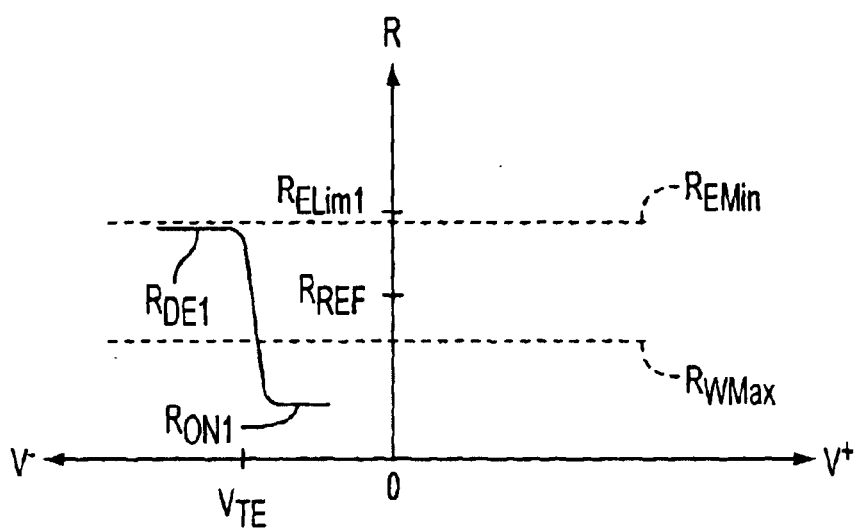
FIG. 5B is a graphical diagram illustrating an erase operation in which the resistance profile of the variable resistance memory cell has drifted to effect an "off" state resistance which is too low.
Figure 5C:
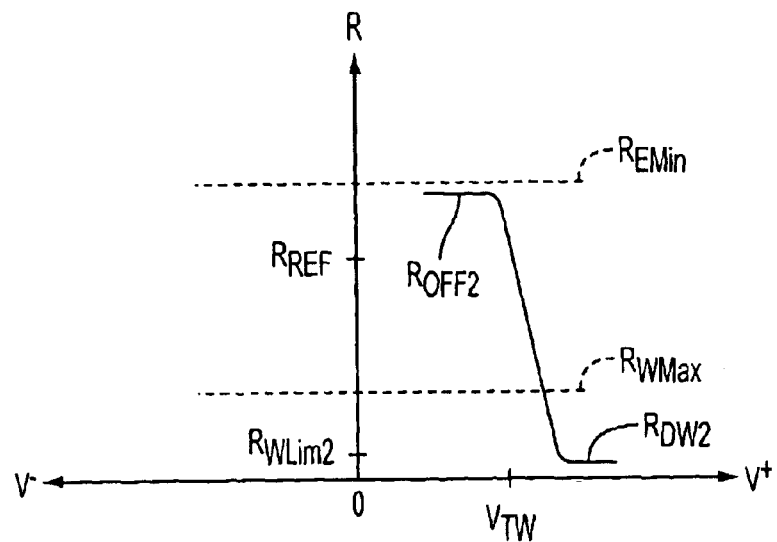
FIG. 5C is a graphical diagram illustrating a write operation in which the resistance profile of the variable resistance memory cell has drifted to effect an "on" state resistance which is too low.

Returning now to FIG. 6, if $R_{TEST}$ is found to be less than $R_{WLim1}$ at process segment 114, then $R_{TEST}$ is compared with a value $R_{WLim2}$, shown in FIG. 5C and representing a lower tolerance resistance level for the low resistance state. The resistance level $R_{WLim2}$ designates the lowest resistance level from which a threshold erase signal is capable of switching the memory cell from the low resistance state to at least the minimum stable resistance level $R_{EMin}$ in the high resistance state. If $R_{TEST}$ is less than or equal to $R_{WLim2}$, then the "on" state resistance is determined to be too low, and another type of reset pulse is applied in the form of a "soft" erase pulse, as will be described below (process segment 116), whereupon the process then returns to process segment 102 to check the resistance profile of another cell.

Since the memory cell is in the low resistance state, it is desirable in this situation to correct the detected resistance profile drift without changing the stored state (i.e., "on") of the memory cell. Rather than correcting the resistance profile drift by shocking the cell, as with the "hard" write pulse, the "soft" erase pulse corrects the overwrite condition by driving a relatively small quantity of metal ions in the chalcogenide material away from the conduction channels and/or into the source layer to increase the overall resistance in the memory cell without switching the memory cell into the high resistance state.

Figure 8A:
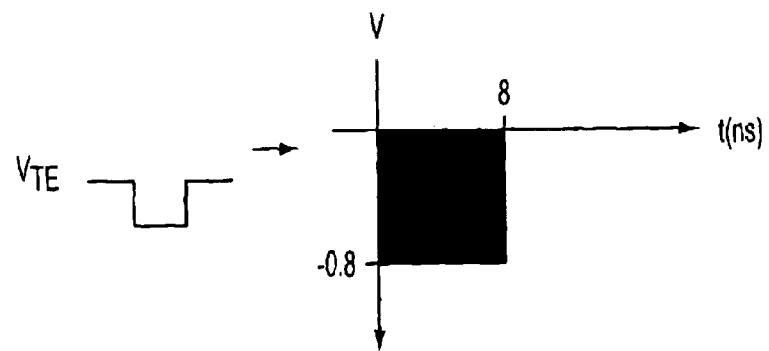
FIG. 8A is a graphical illustration of a pulse applied to a memory cell for a normal erase operation.
Figure 8B:
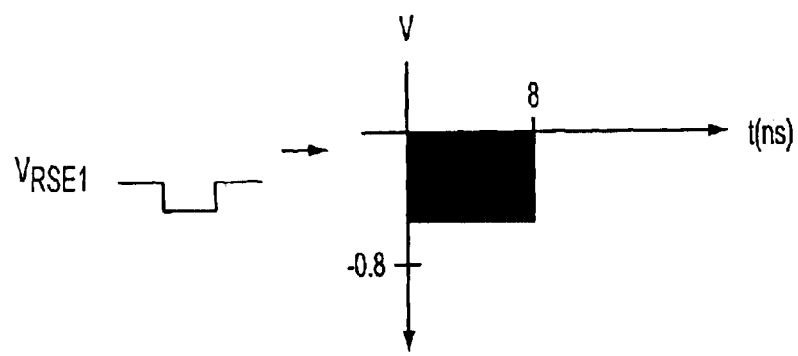
FIG. 8B is a graphical illustration of a "soft" erase-type reset pulse having a voltage magnitude less than that of a normal erase pulse, for correcting resistance profile drift in which an "on" state resistance becomes too low.
Figure 8C:
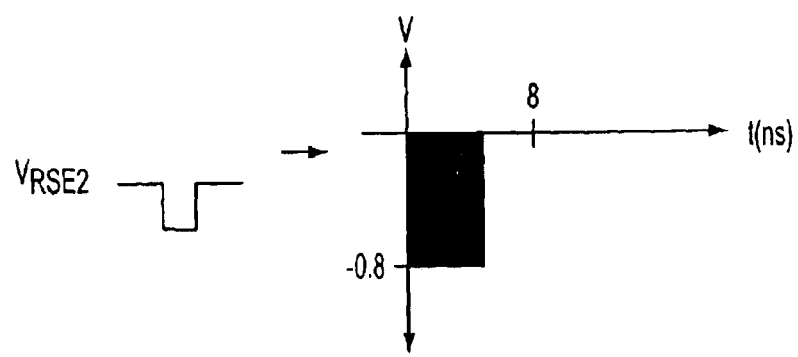
FIG. 8C is a graphical illustration of a "soft" erase-type reset pulse having a pulse width less than that of a normal erase pulse, for correcting resistance profile drift in which an "on" state resistance becomes too low.

The "soft" erase pulse applied in process segment 116 in FIG. 6 can be performed in one of several ways, similarly to the "hard" write pulse. FIG. 8A illustrates a "normal" erase pulse $V_{TE}$ having, for example, a voltage level of −0.8 V and a duration of 8 ns. A first type of "soft" erase pulse $V_{RSE1}$ is illustrated in FIG. 8B, in which the voltage magnitude of the "soft" erase pulse is less than the voltage magnitude of a normal erase pulse. A second type of "soft" erase pulse $V_{RSE2}$ is illustrated in FIG. 8C, in which the pulse width of the "soft" erase pulse is less than the pulse width of a normal erase pulse. In a third type of "soft" erase pulse, the reset pulse may have both a smaller voltage magnitude and a shorter pulse width than the normal erase pulse. The voltage magnitude and pulse width of the "soft" erase pulse may vary depending on the amount of drift as may be detected by the processor or system, i.e., the amount by which $R_{TEST}$ falls below $R_{WLim2}$, as long as at least one of the voltage magnitude and pulse width of the reset pulse are less than the corresponding values for a normal erase pulse, so as to avoid changing the programmed state of the memory cell.

Referring once again to the process shown in FIG. 6, if $R_{TEST}$ is found to be greater than $R_{WLim2}$ at process segment 114, then the memory cell is determined to be functioning properly, and no corrective action is needed, whereupon the process returns to process segment 102 to select another memory cell for testing.

At process segment 106 in FIG. 6, if $R_{TEST}$ is found to be greater than $R_{REF}$, the memory cell is determined to be in the "off" state at process segment 118, whereupon $R_{TEST}$ is compared with a resistance level $R_{ELim1}$, representing a lower tolerance level just above the minimum stable resistance level $R_{EMin}$ for the high resistance state, as shown in FIG. 5B (process segment 120). If $R_{TEST}$ is less than or equal to $R_{ELim1}$, then the "off" state resistance is determined to be too low, and a reset pulse is applied in the form of a "hard" erase pulse, described below, at process segment 122. After the resistance profile for the high resistance state is reset in the memory cell by application of the "hard" erase pulse, the process returns to process segment 102 to select another cell for testing.

Similarly to the "hard" write pulse, the "hard" erase pulse applied in process segment 122 serves to reestablish the original resistance profile of the memory cell in the high resistance state, possibly by redistributing the concentration profile of metal ions in the chalcogenide material to the initial level in the cell. In this case, the "hard" erase pulse flushes out the "extra" metal ions that have accumulated in the chalcogenide material over the operation of many write/erase cycles. Upon driving the surplus metal ions back into the source layer, the resistance of the memory cell in the "off" state is restored to a level comfortably above the minimum stable resistance level $R_{WMax}$ for the high resistance state.

Figure 9A:
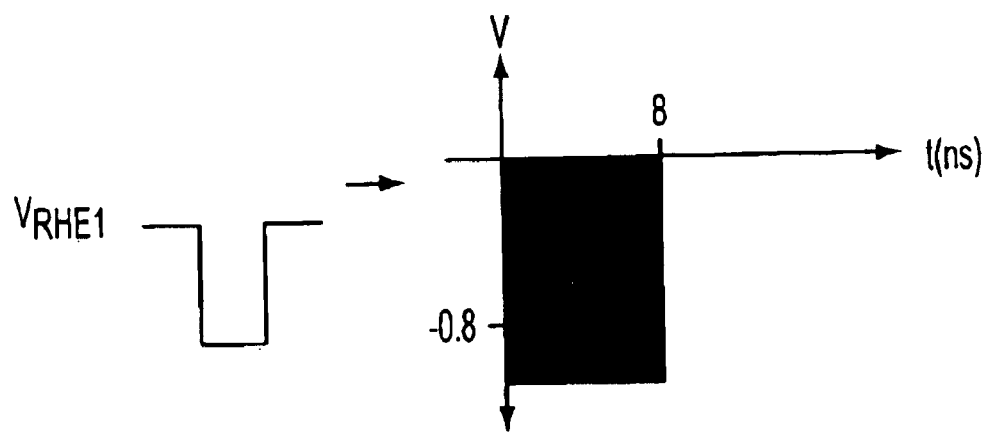
FIG. 9A is a graphical illustration of a "hard" erase-type reset pulse having a voltage magnitude greater than that of a normal erase pulse, for correcting resistance profile drift in a memory cell in which an "off" state resistance which becomes too low.
Figure 9B:
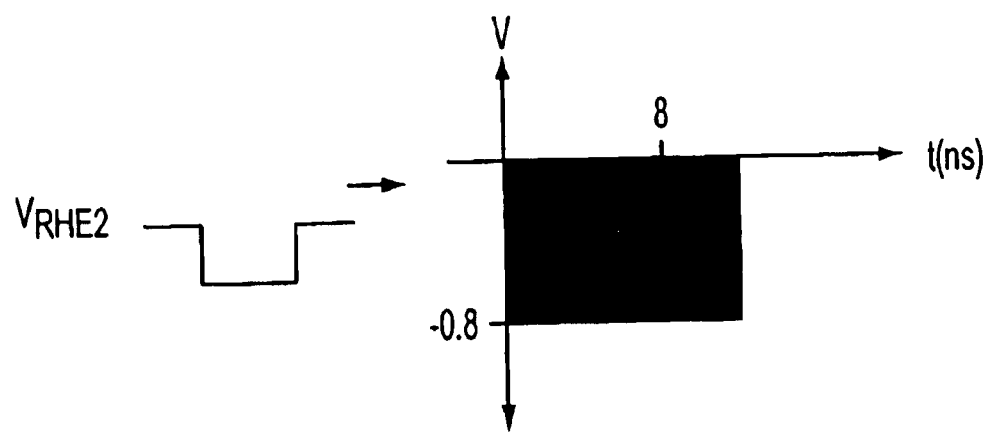
FIG. 9B is a graphical illustration of a "hard" erase-type reset pulse having a greater pulse width than that of a normal erase pulse, for correcting resistance profile drift in a memory cell in which an "off" state resistance becomes too low.

As with the "hard" write pulse, the "hard" erase pulse may be applied by increasing the voltage level and/or the pulse width relative to erase voltage $V_{TE}$ applied in a normal erase operation. As mentioned above, a "normal" erase pulse is illustrated in FIG. 8A having, for example, a voltage level of −0.8 V and a duration of 8 ns. A first type of "hard" erase pulse is shown in FIG. 9A, in which the applied pulse is the same duration as the normal erase pulse, but has a negative voltage level of a magnitude greater than the −0.8 V of the normal erase pulse. An alternative "hard" erase pulse is shown in FIG. 9B, in which the "hard" erase pulse has the same magnitude as the normal erase pulse, but has a longer pulse width. In a further alternative, the "hard" erase pulse may have both a greater magnitude and a longer duration than the normal erase pulse. The amount by which the voltage level or the duration of the "hard" erase pulse exceeds that of the normal erase pulse may vary depending on the amount of drift, i.e., the amount by which $R_{TEST}$ falls below $R_{ELim1}$.

Figure 5D:
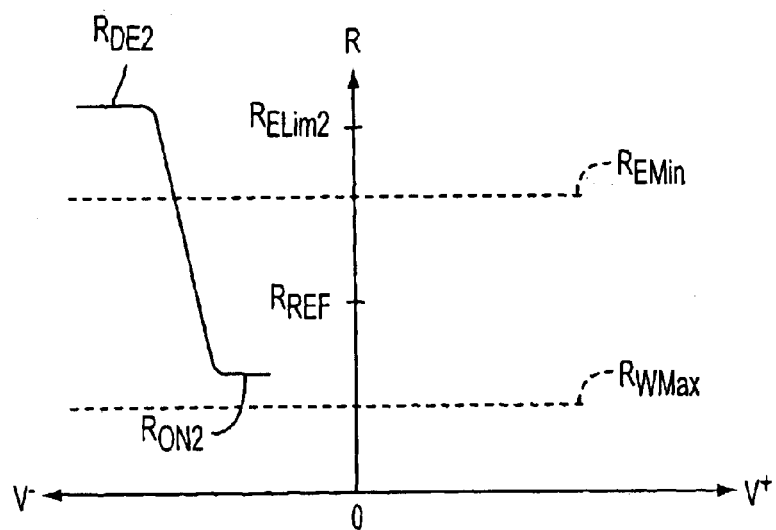
FIG. 5D is a graphical diagram illustrating an erase operation in which the resistance profile of the variable resistance memory cell has drifted to effect an "off" state resistance which is too high.

Returning again to the process of FIG. 6, if $R_{TEST}$ is found to be greater than $R_{ELim1}$ at process segment 120, then $R_{TEST}$ is compared with a resistance level $R_{ELim2}$, shown in FIG. 5D and representing an upper tolerance resistance level for the high resistance state (process segment 124). The resistance level $R_{WLim2}$ designates the highest resistance level from which a threshold write signal is capable of switching the memory cell from the high resistance state to or below the maximum stable resistance level $R_{WMax}$ in the low resistance state. If $R_{TEST}$ is greater than or equal to $R_{ELim2}$, then the "off" state resistance is determined to be too high, and a "soft" write pulse is applied to reset the resistance profile of the memory cell, as will be described below (process segment 126), whereupon the process then returns to process segment 102 to check the resistance profile of another cell.

The "soft" write pulse is similar to the "soft" erase pulse in that it is designed to correct the resistance profile drift by applying a pulse counter to the direction of drift, but not strong enough to change the resistance state (i.e., "off") of the memory cell. Thus, the "soft" write pulse corrects the overerase condition by driving a relatively small quantity of metal ions from the source layer into the chalcogenide material and/or towards the conduction channels to thereby increase the concentration of metal ions in the chalcogenide material and/or reduce the resistance through the conduction channels in the memory cell respectively, without switching the memory cell into the low resistance state.

Figure 10A:
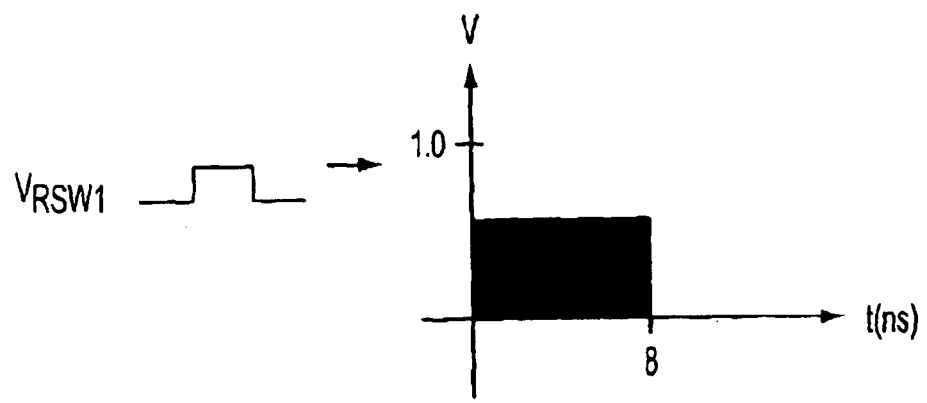
FIG. 10A is a graphical illustration of a "soft" write-type reset pulse having a voltage magnitude less than that of a normal write pulse, for correcting resistance profile drift in which an "off" state resistance becomes too high.
Figure 10B:
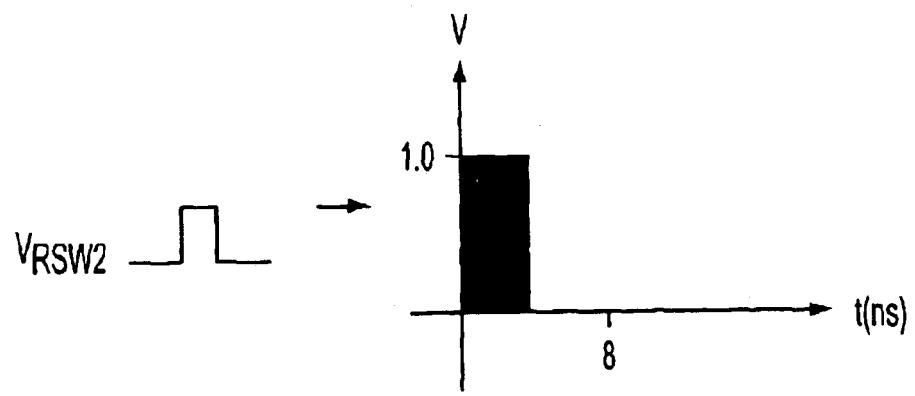
FIG. 10B is a graphical illustration of a "soft" write-type reset pulse having a pulse width less than that of a normal write pulse, for correcting resistance profile drift in which an "off" state resistance becomes too high.

The "soft" write pulse applied in process segment 126 in FIG. 6 can be performed in one of several ways, similarly to the "soft" erase pulse. Using the illustrative "normal" write pulse $V_{TW}$ shown in FIG. 7A as a reference, a first type of "soft" write pulse $V_{RSW1}$ is illustrated in FIG. 10A, in which the voltage magnitude of the "soft" write pulse is less than the voltage magnitude of a normal write pulse. A second type of "soft" write pulse $V_{RSW2}$ is illustrated in FIG. 10B, in which the pulse width of the "soft" write pulse is less than the pulse width of a normal write pulse. In a third type of "soft" write pulse, the reset pulse may have both a smaller voltage magnitude and a shorter pulse width than the normal write pulse. The voltage magnitude and pulse width of the "soft" write pulse may vary depending on the amount of drift as may be detected by the processor or system, i.e., the amount by which $R_{TEST}$ is above $R_{ELim2}$, as long as at least one of the voltage magnitude and pulse width of the reset pulse are less than the corresponding values for a normal write pulse, so as to avoid switching the memory cell into the low resistance state.

At process segment 124 in FIG. 6, if $R_{TEST}$ is determined to be less than $R_{ELim2}$, the memory cell is determined to be functioning properly, and no corrective action is needed. At this point, the process returns to process segment 102 to select another memory cell for testing.

In a variation of the process shown and described above with reference to FIG. 6, the resistance profile drift can be corrected by only applying one or a series of "soft" write or erase pulses. Thus, correction of an overerase condition and an overwrite condition may be performed as described above, but for an underwrite condition or an undererase condition, instead of applying the "hard" write or erase pulses, respectively, the resistance profile of the memory cell is reset with one or a series of "soft" write or erase pulses. This allows the correction in the cell to be performed with greater control, since the resistance is changed gradually, in smaller increments than achieved with the "hard" write and erase pulses.

For example, upon detection of resistance profile drift in a memory cell and identification of the direction of drift and the resistance state of the cell, a "soft" reset pulse in the appropriate direction may be applied as discussed above. The cell may then be retested to determine if another "soft" reset pulse is needed. The application of the "soft" reset pulse and the retesting may be repeated until the detected resistance of the memory cell falls within the expected range. Alternatively, the amount of resistance profile drift may be detected during the initial testing stage, and the appropriate number of "soft" reset pulses may be automatically applied based on predetermined and known values for the magnitude and pulse width of the reset pulses.

In another aspect of the present invention, the resistance drift may be controlled by periodically pulsing each cell both slightly high and slightly low. The field thus induced serves to reinforce the original resistance profile of the memory cell and prevent the onset of or reduce the pace of the resistance profiles drifting lower in the memory cells.

As described above, the present invention addresses the problem of resistance drift in the memory cells of chalcogenide PCRAM devices that may occur after significant use of the memory devices, such as may be caused by variations and imperfections in the wafers originating during the manufacturing of the wafers used to produce the memory devices, for example. Moreover, the present invention also provides another benefit in that the magnitudes and pulse widths of the voltages required to write and to erase the memory cells do not have to be precisely controlled to be the same for each write/erase operation. Generally, it is desirable to write and erase memory cells with consistent voltage pulses for each write/erase cycle, since inconsistent write/erase voltages or write/erase voltages that are consistently too high, too long, too low or to short may contribute to faster and/or greater deviation of the resistance profiles of the memory cells. The present invention, however, allows the write and erase voltages to be controlled less stringently (and more economically), since any changes in resistance profiles of the memory cells resulting from the less precisely controlled write and/or erase voltages can be corrected as needed to reset each memory cell to the original operating profile.

While the present invention has been described above with reference to a particular problem identified with a specific exemplary embodiment of a PCRAM cell, the present invention is not limited to memory devices having PCRAM cells of this structure or for addressing the specific issues discussed above. In particular, the scope and applicability of the present invention not only encompasses the PCRAM structure expressly disclosed herein, but also encompasses other PCRAM structures including chalcogenide PCRAM cells having different layer thicknesses, different stoichiometric compositions, different numbers of layered components and layered components of different materials, and especially including any chalcogenide PCRAM structure having silver selenide as one of the layers. Moreover, the present invention is also applicable to other non-volatile or semi-volatile variable resistance memory devices, including memory devices incorporating carbon-polymers, amorphous silicon, and perovskite materials as disclosed hereinabove.

The present invention is especially useful for flash memory devices wherein the write voltage levels vary from cycle to cycle. In a flash memory device, the potential stored in each cell for representing the different data values may drift over time and repeated write cycles to the point where it may become difficult to distinguish between the different data storage states. By testing the charge level of each cell in the memory and applying reset pulses when drift is detected, proper separation between data storage states can be maintained for each memory cell in the device. For example, in a NAND type flash memory device, the smart algorithm of the present invention may be used to maintain reliable values being written to a cell by the threshold voltage level $V_t$. If the detected potential in a cell after being written by a voltage $V_t$ is too low, a memory controller will apply a reset pulse (or re-apply a pulse) to the cell to return the stored potential to the expected value.

Figure 11:
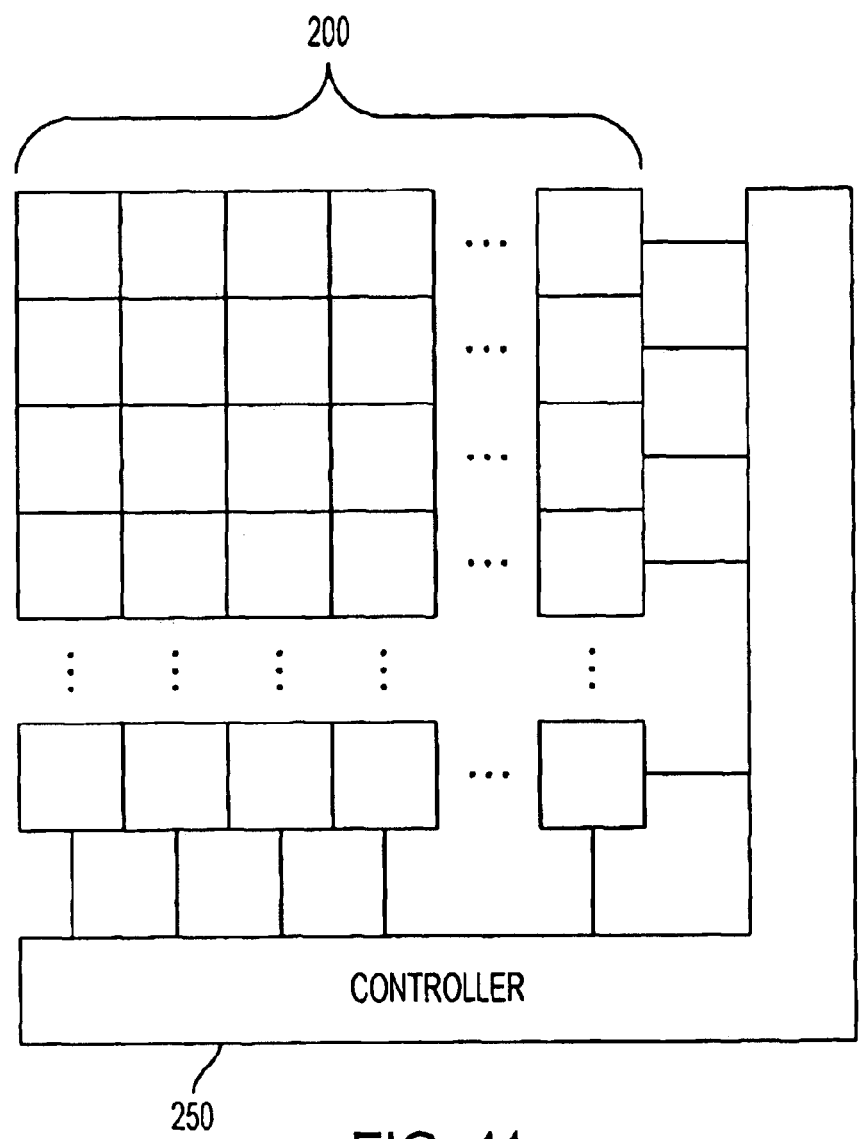
FIG. 11 illustrates an array of variable resistance memory cells and a memory controller which may be operated in accordance with the present invention.

As illustrated in FIG. 11, the present invention for correcting resistance profile drift in variable resistance memory cells is generally performed by a memory controller 250 which controls the read, write and erase functions of each of the cells in a memory array 200.

Figure 2:
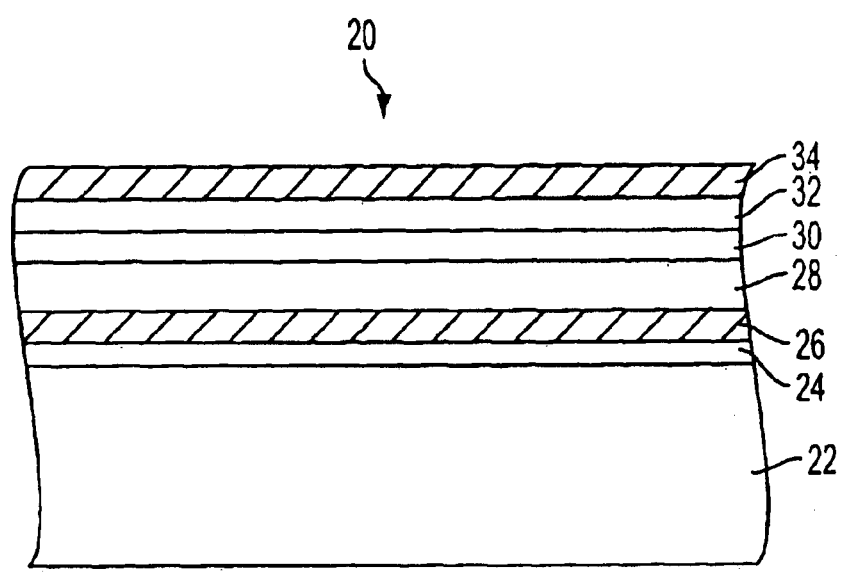
FIG. 2 shows the structure of an exemplary chalcogenide PCRAM cell.
Figure 3A:
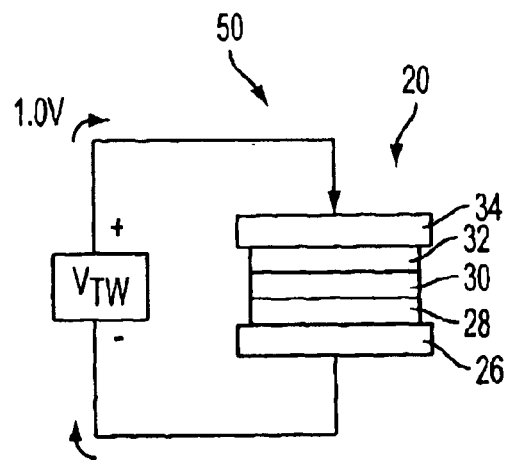
FIG. 3A is an illustrative diagram for explaining the application of a write signal to a variable resistance memory cell.
Figure 3B:
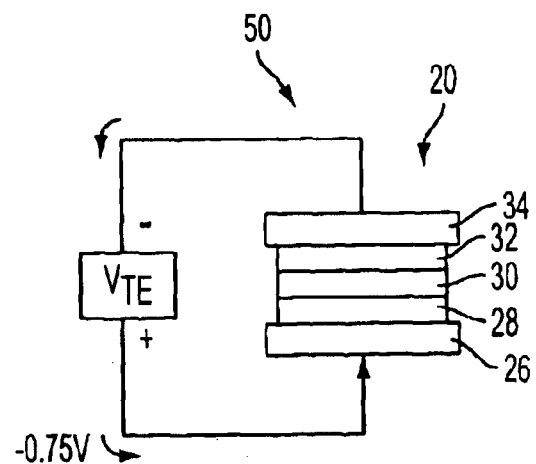
FIG. 3B is an illustrative diagram for explaining the application of an erase signal to a variable resistance memory cell.
Figure 4A:
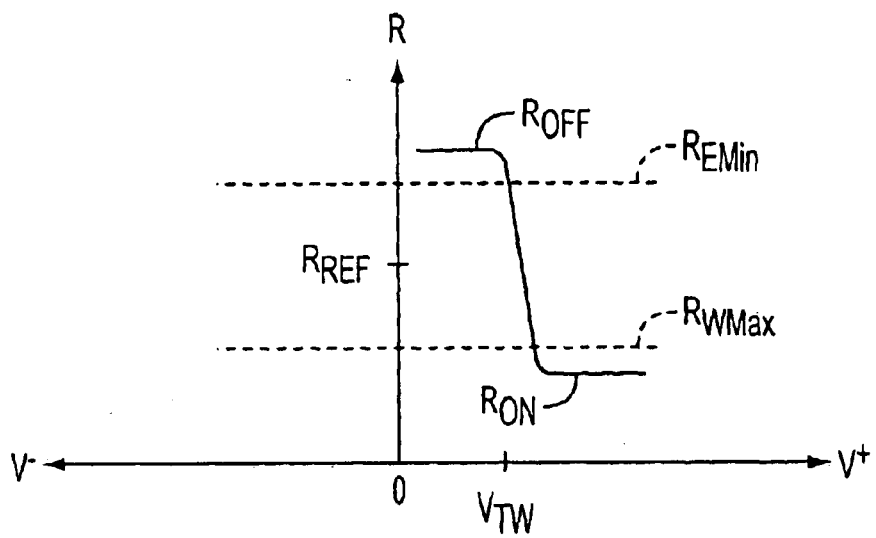
FIG. 4A is a graphical diagram illustrating a normal write operation.
Figure 4B:
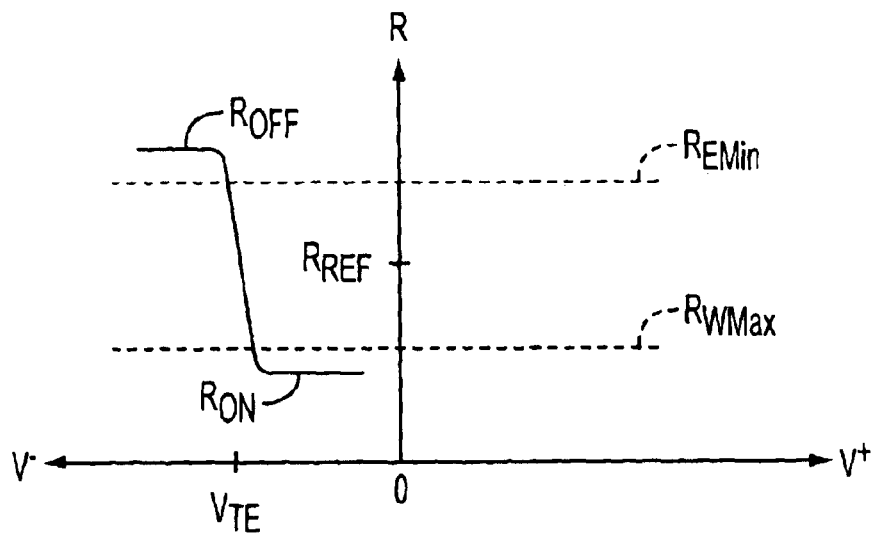
FIG. 4B is a graphical diagram illustrating a normal erase operation.
Figure 12:
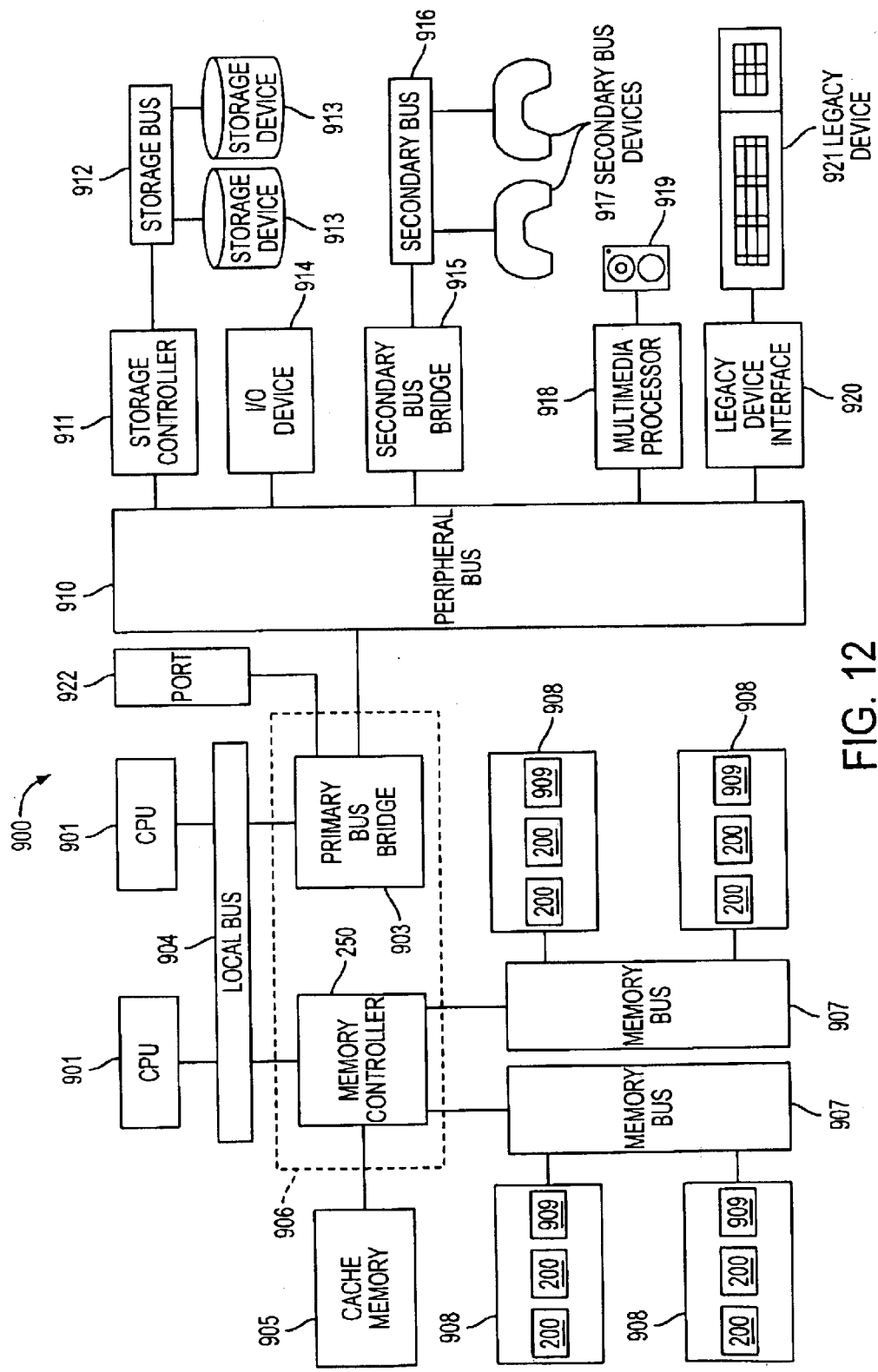
FIG. 12 shows an exemplary processor system incorporating a memory device having the refresh scheme according to the present invention.

FIG. 12 illustrates an exemplary processing system 900 which may utilize the memory device described above in connection with FIGS. 2 and 11 and operated in connection with the processes described above with reference to FIGS. 3A–10B. The processing system 900 includes one or more processors 901 coupled to a local bus 904. A memory controller 250 and a primary bus bridge 903 are also coupled the local bus 904. The processing system 900 may include multiple memory controllers 250 and/or multiple primary bus bridges 903. The memory controller 902 and the primary bus bridge 903 may be integrated as a single device 906.

The memory controller 250 is also coupled to one or more memory buses 907. Each memory bus accepts memory components 908 which include at least one memory device 200 of the present invention. The memory components 908 may be a memory card or a memory module. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 250 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 250 may implement a cache coherency protocol. If the memory controller 250 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, a miscellaneous I/O device 914, a secondary bus bridge 915 communicating with a secondary bus 916, a multimedia processor 918, and a legacy device interface 920. The primary bus bridge 903 may also coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be a local area network interface, such as an Ethernet card. The secondary bus bridge 915 may be used to interface additional devices via another bus to the processing system. For example, the secondary bus bridge may be a universal serial port (USB) controller used to couple USB devices 917 via to the processing system 900. The multimedia processor 918 may be a sound card, a video capture card, or any other type of media interface, which may also be coupled to additional devices such as speakers 919. The legacy device interface 920 is used to couple at least one legacy device 921, for example, older styled keyboards and mice, to the processing system 900.

The processing system 900 illustrated in FIG. 12 is only an exemplary processing system with which the invention may be used. While FIG. 12 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory arrays 200. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

While the invention has been described in detail in connection with preferred embodiments known at the time, it should be readily understood that the invention is not limited to the disclosed embodiments. Rather, the invention can be modified to incorporate any number of variations, alterations, substitutions or equivalent arrangements not heretofore described, but which are commensurate with the spirit and scope of the invention. For example, although the invention is described in connection with specific materials used for the layers of the memory cells, it should be readily apparent that other materials may be substituted for those specifically mentioned. Accordingly, the invention is not limited by the foregoing description or drawings, but is only limited by the scope of the appended claims.

What is claimed is:

1. A method for controlling resistance variation in a variable resistance memory device, the method comprising:
   a) determining a variable resistance memory cell to be in either an "on" state or an "off" state based on a resistance of the memory cell;
   b) if the memory cell is determined to be in the "on" state, determining if the resistance of the memory cell is outside a predetermined resistance range for the "on" state;
   c) if the memory cell is categorized as being in the "off" state, determining if the resistance of the memory cell is outside a predetermined resistance range for the "off" state; and
   d) shifting the resistance of said memory cell to said predetermined resistance range for either the "on" or "off" state by applying at least one reset pulse to said memory cell if the condition tested for in either b) or c) is determined to exist in the memory cell.

2. The method according to claim 1, wherein said act of determining if the resistance of the memory cell is outside a predetermined resistance range for the "on" state includes further comprises determining if the resistance of the memory cell is greater than a predetermined maximum resistance for the "on" state.

3. The method according to claim 2, wherein the at least one reset pulse applied to the memory cell is a "hard" write pulse if the resistance of the memory cell is greater than the predetermined maximum resistance.

4. The method according to claim 3, wherein the "hard" write pulse has a voltage magnitude greater than a threshold voltage of a programming write signal and a pulse width greater than that of said programming write signal.

5. The method according to claim 3, wherein the "hard" write pulse has a voltage magnitude greater than a threshold voltage of a programming write signal.

6. The method according to claim 3, wherein the "hard" write pulse has the same voltage magnitude as a threshold voltage of a programming write signal but a pulse width greater than that of said programming write signal.

7. The method according to claim 2, wherein the at least one reset pulse applied to the memory cell is at least one "soft" write pulse if the resistance of the memory cell is greater than the predetermined maximum resistance.

8. The method according to claim 7, wherein the "soft" write pulse has a voltage magnitude less than a threshold voltage of a programing write signal and a pulse width less than that of a pulse width of said programming write signal.

9. The method according to claim 7, wherein the "soft" write pulse has a voltage magnitude less than a threshold voltage of a programming write signal.

10. The method according to claim 7, wherein the "soft" write pulse has the same voltage magnitude as a threshold voltage of a programming write signal but a pulse width less than that of said programming write signal.

11. The method according to claim 1, wherein said act of determining if the resistance of the memory cell is outside a predetermined resistance range for the "on" state further comprises determining if the resistance of the memory cell is less than a predetermined minimum resistance for the "on" state.

12. The method according to claim 11, wherein the at least one reset pulse applied to the memory cell is at least one "soft" erase pulse if the resistance of the memory cell is less than the predetermined minimum resistance.

13. The method according to claim 12, wherein the at least one "soft" erase pulse has a voltage magnitude less than a threshold voltage of a programming erase signal and a pulse width less than that of a pulse width of said programming erase signal.

14. The method according to claim 12, wherein the "soft" erase pulse has a voltage magnitude less than a threshold voltage of a programming erase signal.

15. The method according to claim 12, wherein the "soft" erase pulse has the same voltage magnitude as a threshold voltage of a programming erase signal but a pulse width less than that of said programming erase signal.

16. The method according to claim 12, wherein the "hard" erase pulse has a voltage magnitude greater than a threshold voltage of a programming erase signal.

17. The method according to claim 12, wherein the "hard" erase pulse has the same voltage magnitude as a threshold voltage of a programming erase signal but a pulse width greater than that of said programming erase signal.

18. The method according to claim 1, wherein said act of determining if the resistance of the memory cell is outside a predetermined resistance range for the "off" state further comprises determining if the resistance of the memory cell is less than a predetermined minimum resistance for the "off" state.

19. The method according to claim 18, wherein the at least one reset pulse applied to the memory cell is a "hard" erase pulse if the resistance of the memory cell is less than the predetermined minimum resistance.

20. The method according to claim 19, wherein the "hard" erase pulse has a voltage magnitude greater than a threshold voltage of a programming erase signal and a pulse width greater than that of a pulse width of said programming erase signal.

21. The method according to claim 1, wherein said act of determining if the resistance of the memory cell is outside a predetermined resistance range for the "off" state further comprises determining if the resistance of the memory cell is greater than a predetermined maximum resistance for the "off" state.

22. The method according to claim 21, wherein the at least one reset pulse applied to the memory cell is at least one "soft" write pulse if the resistance of the memory cell is greater than the predetermined maximum resistance.

23. The method according to claim 22, wherein the at least one "soft" write pulse has a voltage magnitude less than a threshold voltage of a programming write signal and a pulse width less than that of a pulse width of said programming write signal.

24. The method according to claim 1, wherein acts a) through d) are performed at a predetermined frequency during operation of a processor device.

25. The method according to claim 1, wherein the memory cell is a PCRAM cell.

26. The method according to claim 25, wherein the PCRAM cell comprises a silver selenide layer.

27. The method according to claim 1, further comprising:
   e) prior to said act of determining the variable resistance memory cell to be in either an "on" or an "off" state, selecting the memory cell from among an array of variable resistance memory cells; and
   f) repeating acts a) through e) for a second memory cell within the array of variable resistance memory cells.

28. The method according to claim 27, further comprising performing a plurality of write/erase cycles in the array of variable resistance memory cells during operation of a processor device, and wherein the acts of a) through f) are performed together at a predetermined frequency during the operation of said processor device.

29. A method of controlling an undererase drift condition in a variable resistance memory cell, comprising:
   a) comparing the resistance of the memory cell with a reference resistance range and identifying the memory cell as being programmed to a high resistance state if the resistance is above the reference resistance range;
   b) if the memory cell is identified as being programmed to the high resistance state, comparing the resistance of the memory cell with a predetermined minimum resistance; and
   c) if the resistance of the memory cell is not greater than the predetermined minimum resistance, applying at least one reset pulse to the memory cell to shift the memory cell to an original resistance range for the high resistance state of the memory cell.

30. The method according to claim 29, wherein the at least one reset pulse is a "hard" reset pulse of sufficient magnitude and/or duration to increase the resistance of the memory cell in the high resistance state to greater than the predetermined minimum resistance.

31. The method according to claim 30, wherein the PCRAM cell comprises a silver selenide layer.

32. The method according to claim 29, wherein the at least one reset pulse is at least one "soft" reset pulse of sufficient magnitude and/or duration to increase the resistance of the memory cell in the high resistance state to greater than the predetermined minimum resistance.

33. The method according to claim 29, wherein the memory cell is a PCRAM cell.

34. A method of controlling an underwrite drift condition in a variable resistance memory cell, comprising:
   a) comparing a resistance of the memory cell with a reference resistance range and identifying the memory cell as being programmed to a low resistance state if the resistance is below the reference resistance range;
   b) if the memory cell is identified as being programmed to the low resistance state, comparing the resistance of the memory cell with a predetermined maximum resistance; and
   c) if the resistance of the memory cell is not less than the predetermined maximum resistance, applying at least one reset pulse to the memory cell to shift the memory cell to an original resistance range for the low resistance state of the memory cell.

35. The method according to claim 34, wherein the at least one reset pulse is a "hard" reset pulse of sufficient magnitude and duration to decrease the resistance of the memory cell in the low resistance state to lower than the predetermined maximum resistance.

36. The method according to claim 34, wherein the at least one reset pulse is at least one "soft" reset pulse of sufficient magnitude and duration to decrease the resistance of the memory cell in the low resistance state to lower than the predetermined maximum resistance.

37. The method according to claim 34, wherein the memory cell is a PCRAM cell.

38. The method according to claim 37, wherein the PCRAM cell comprises a silver selenide layer.

39. A method of controlling an overerase drift condition in a variable resistance memory cell, comprising:
   a) comparing the resistance of the memory cell with a reference resistance range and identifying the memory cell as being programmed to a high resistance state if the resistance is above the reference resistance range;
   b) if the memory cell is identified as being programmed to the high resistance state, comparing the resistance of the memory cell with a predetermined maximum resistance; and
   c) if the resistance of the memory cell is greater than the predetermined maximum resistance, applying at least one reset pulse to the memory cell to shift the memory cell to an original resistance range for the high resistance state of the memory cell.

40. The method according to claim 39, wherein the at reset pulse is a "hard" reset pulse of sufficient magnitude and duration to decrease the resistance of the memory cell in the high resistance state to lower than the predetermined maximum resistance.

41. The method according to claim 39, wherein the at least one reset pulse is at least one "soft" reset pulse of sufficient magnitude and duration to decrease the resistance of the memory cell in the high resistance state to lower than the predetermined maximum resistance.

42. The method according to claim 39, wherein the memory cell is a PCRAM cell.

43. The method according to claim 42, wherein the PCRAM cell comprises a silver selenide layer.

44. A method of controlling an overwrite drift condition in a variable resistance memory cell, comprising:
   a) comparing a resistance of the memory cell with a reference resistance range and identifying the memory cell as being programmed to a low resistance state if the resistance is below the reference resistance range;
   b) if the memory cell is identified as being programmed to the low resistance state, comparing the resistance of the memory cell with a predetermined minimum resistance; and
   c) if the resistance of the memory cell is greater than the predetermined minimum resistance, applying at least one reset pulse to the memory cell to shift the memory cell to an original resistance range for the low resistance state of the memory cell.

45. The method according to claim 44, wherein the at least one reset pulse is a "hard" reset pulse of sufficient magnitude and duration to increase the resistance of the memory cell in the low resistance state to greater than the predetermined minimum resistance.

46. The method according to claim 44, wherein the at least one reset pulse is at least one "soft" reset pulse of sufficient magnitude and duration to increase the resistance of the memory cell in the low resistance state to greater than the predetermined minimum resistance.

47. The method according to claim 44, wherein the memory cell is a PCRAM cell.

48. The method according to claim 47, wherein the PCRAM cell comprises a silver selenide layer.

49. A method for operating a PCRAM memory device, comprising:
   determining if a resistance of a PCRAM memory cell programmed to a high resistance state has deviated from an original resistance range for a high resistance state thereof; and
   applying at least one voltage potential to the PCRAM memory cell to shift the PCRAM memory cell to within the original resistance range for the high resistance state.

50. The method according to claim 49, wherein the at least one voltage potential applied is a "hard" erase pulse.

51. The method according to claim 50, wherein the "hard" erase pulse has a voltage magnitude greater than a threshold voltage of a programming erase signal.

52. The method according to claim 50, wherein the "hard" erase pulse has a pulse width greater than a threshold voltage of said programming erase signal.

53. The method according to claim 50, wherein the "hard" erase pulse has the same voltage magnitude as a threshold voltage of a programming erase signal but a pulse width greater than that of said programming erase signal.

54. The method according to claim 49, wherein the at least one voltage potential applied is at least one "soft" write pulse.

55. The method according to claim 54, wherein the "soft" write pulse has a voltage magnitude less than a threshold voltage of a programming write signal.

56. The method according to claim 55, wherein the "soft" write pulse has a pulse width less than a threshold voltage of said programming write signal.

57. The method according to claim 54, wherein the "soft" write pulse has the same voltage magnitude as a threshold voltage of a programming write signal but a pulse width less than that of said programming write signal.

58. The method according to claim 49, wherein the at least one voltage potential is applied when the resistance of the PCRAM memory cell is determined to have deviated from the original resistance range.

59. A method for operating a PCRAM memory device, comprising:
   determining if a resistance of a PCRAM memory cell programmed to a low resistance state has deviated from an original resistance range for a low resistance state thereof; and
   applying at least one voltage potential to the PCRAM memory cell to shift the PCRAM memory cell to within the original resistance range for the low resistance state.

60. The method according to claim 59, wherein the at least one voltage potential applied is a "hard" write pulse.

61. The method according to claim 60, wherein the "hard" write pulse has a voltage greater than a threshold voltage of a programming write signal.

62. The method according to claim 61, wherein the "hard" write pulse has a pulse width greater than a threshold voltage of said programming write signal.

63. The method according to claim 60, wherein the "hard" write pulse has the same voltage as a threshold voltage of a programming write signal but a pulse width greater than that of said programming write signal.

64. The method according to claim 59, wherein the at least one voltage potential applied is at least one "soft" erase pulse.

65. The method according to claim 64, wherein the "soft" erase pulse has a voltage magnitude less than a threshold voltage of a programming erase signal.

66. The method according to claim 65, wherein the "soft" erase pulse has a pulse width less than a threshold voltage of said programming erase signal.

67. The method according to claim 64, wherein the "soft" erase pulse has the same voltage magnitude as a threshold voltage of a programming erase signal but a pulse width less than that of said programming erase signal.

68. The method according to claim 59, wherein the at least one voltage potential is applied when the resistance of the PCRAM memory cell is determined to have deviated from the original resistance range.

69. A method for operating a PCRAM memory device, comprising:
   determining that a resistance profile of a PCRAM memory cell has deviated from a programmed resistance profile of the PCRAM memory cell; and
   applying at least one voltage potential to the PCRAM memory cell to shift the resistance of the PCRAM memory cell to the programmed resistance profile for the PCRAM memory cell.

70. A method of operating a PCRAM memory device, comprising:
   determining if a variable resistance memory cell is programmed to an "on" state or an "off" state based on a current resistance of the memory cell; and
   applying at least one voltage pulse of sufficient magnitude and/or duration to the memory cell to shift the memory cell to an original resistance range for the memory cell based on the "on" or "off" state of the cell.

71. The method according to claim 70, wherein the at least one voltage pulse applied is a "hard" write pulse.

72. The method according to claim 70, wherein the at least one voltage pulse applied is a "hard" erase pulse.

73. The method according to claim 70, wherein the at least one voltage pulse applied is at least one "soft" write pulse.

74. The method according to claim 70, wherein the at least one voltage pulse applied is at least one "soft" erase pulse.

75. A memory device comprising:
   an array of variable resistance memory cells; and
   a controller coupled to the memory array which periodically performs an algorithm to detect resistance profile drift in the memory cells of the array, and which restores an original resistance profile in any of said memory cells in which resistance profile drift is detected by applying at least one pulse with sufficient magnitude and/or duration to shift the current resistance of the memory cells to the original resistance profile of said memory cells.

76. The memory device according to claim 75, wherein the controller controls the application of a "hard" write pulse to a memory cell in the array if the controller detects that a resistance of the memory cell is in a low resistance state and has deviated from an original resistance range for the low resistance state to an underwrite condition.

77. The memory device according to claim 75, wherein the controller controls application of at least one "soft" erase pulse to a memory cell in the array if the controller detects that a resistance of the memory cell is in a low resistance state and has deviated from an original resistance range for the low resistance state to an undererase condition.

78. The memory device according to claim 75, wherein the controller controls application of at least one "soft" write pulse to a memory cell in the array if the controller detects that a resistance of the memory cell is in a high resistance state and has deviated from an original resistance range for the high resistance state to an overerase condition.

79. The memory device according to claim 75, wherein the controller controls application of a "hard" erase pulse to any memory cell in the array if the controller detects that a resistance of the memory cell is in a high resistance state and has deviated from an original resistance range for the high resistance state to an overwrite condition.

80. A processor system, comprising:
a processor for receiving and processing data;
at least one memory array of variable resistance memory cells for exchanging data with the processor; and
a controller connected to the at least one memory array, wherein the controller
 manages memory access requests from the processor to the at least one memory device,
 periodically performs an algorithm to detect resistance profile drift in the memory cells of the array, and
 restores an original resistance profile in any memory cell in which resistance profile drift is detected.

81. A processor system, comprising:
a processor for receiving and processing data;
at least one memory array of variable resistance memory cells for exchanging data with the processor; and
a controller connected to the at least one memory array, wherein the controller:
 performs an algorithm which detects if the resistance of any of the memory cells among the array is in a high resistance state, and whether the resistance of any cells detected to be in the high resistance cells is below a predetermined minimum level or is above a predetermined maximum level for the high resistance state,
 controls application of at least one reset pulse to any cells detected to be in the high resistance state and having a resistance either below the predetermined minimum level or above the predetermined maximum level to thereby restore a predetermined resistance range for the high resistance state,
 detects if the resistance of any of the memory cells among the array is in a low resistance state, and whether the resistance of any cells detected to be in the low resistance state is above a predetermined maximum level or is below a predetermined minimum level for the low resistance state, and
 controls application of at least one reset pulse to any cells detected to be in the low resistance state and having a resistance either above the predetermined maximum level or below the predetermined minimum level to thereby restore a predetermined resistance range for the low resistance state.

82. The processor system according to claim 81, claim wherein the controller performs the algorithm at predetermined time intervals.

83. A method of controlling resistance variation in a memory cell, said method comprising:
 determining if the resistance of the memory cell is outside a first predetermined resistance range corresponding to an "on" state for said memory cell, wherein if the resistance of said memory cell is outside the first predetermined resistance range, applying at least one pulse to said memory cell to shift the resistance of said memory cell to return to a resistance within said first predetermined resistance range for said "on" state.

84. The method of claim 83, wherein said act of applying at least one pulse comprises applying a "hard" write pulse to said memory cell.

85. The method of claim 84, wherein said "hard" write pulse is applied with a higher voltage magnitude than a programming write voltage for said memory cell.

86. The method of claim 84, wherein said "hard" write pulse is applied with a longer duration than a programming write pulse for said memory cell.

87. The method of claim 83, wherein said act of applying at least one pulse comprises applying a "soft" erase pulse to said memory cell.

88. The method of claim 87, wherein said "soft" erase pulse is applied with a lower voltage magnitude than a programming erase voltage for said memory cell.

89. The method of claim 87, wherein said "soft" erase pulse is applied with a shorter duration than a programming erase pulse for said memory cell.

90. A method of controlling resistance variation in a memory cell, said method comprising:
 determining if the resistance of the memory cell is outside a first predetermined resistance range corresponding to an "off" state for said memory cell, wherein if the resistance of said memory cell is outside the first predetermined resistance range, applying at least one pulse to said memory cell to shift the resistance of said memory cell to return to a resistance within said first predetermined resistance range for said "off" state.

91. The method of claim 90, wherein said act of applying at least one pulse comprises applying a "hard" erase pulse to said memory cell.

92. The method of claim 91, wherein said "hard" erase pulse is applied with a higher voltage magnitude than a programming erase voltage for said memory cell.

93. The method of claim 91, wherein said "hard" erase pulse is applied with a longer duration than a programming erase pulse for said memory cell.

94. The method of claim 90, wherein said step of applying at least one pulse comprises applying a "soft" write pulse to said memory cell.

95. The method of claim 94, wherein said "soft" write pulse is applied with a lower voltage magnitude than a programming write voltage for said memory cell.

96. The method of claim 94, wherein said "soft" write pulse is applied with a shorter duration than a programming write pulse for said memory cell.

* * * * *